US012733229B2

(12) United States Patent
Galatage et al.

(10) Patent No.: US 12,733,229 B2
(45) Date of Patent: Sep. 8, 2026

(54) NANORIBBON STACKS WITHOUT DIELECTRIC PROTECTION CAPS FOR TOP NANORIBBONS

(71) Applicant: Intel Corporation, Santa Clara, CA (US)

(72) Inventors: Rohit Galatage, Hillsboro, OR (US); Cheng-Ying Huang, Portland, OR (US); Jack T. Kavalieros, Portland, OR (US); Marko Radosavljevic, Portland, OR (US); Mauro J. Kobrinsky, Portland, OR (US); Jami Wiedemer, Scappoose, OR (US); Munzarin Qayyum, Hillsboro, OR (US); Evan Clinton, Carrollton, GA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/065,660

(22) Filed: Dec. 14, 2022

(65) Prior Publication Data

US 2024/0204060 A1 Jun. 20, 2024

(51) Int. Cl.

*H10D 64/01* (2025.01)
*H10D 30/01* (2025.01)
*H10D 30/43* (2025.01)
*H10D 30/67* (2025.01)

(52) U.S. Cl.

CPC ........... *H10D 64/01* (2025.01); *H10D 30/014* (2025.01); *H10D 30/031* (2025.01); *H10D 30/43* (2025.01); *H10D 30/6735* (2025.01); *H10D 64/015* (2025.01); *H10D 30/6736* (2025.01)

(58) Field of Classification Search

CPC ..... H10D 64/01; H10D 30/14; H10D 30/6735
USPC .......................................................... 257/401
See application file for complete search history.

(56) References Cited

U.S. PATENT DOCUMENTS

| | | | |
|---|---|---|---|
| 11,387,342 B1 | 7/2022 | Zhang et al. | |
| 2021/0408246 A1* | 12/2021 | Ganguly | H10D 30/6729 |
| 2022/0093474 A1 | 3/2022 | Mishra et al. | |
| 2022/0093747 A1* | 3/2022 | Ohno | H10D 62/8503 |
| 2022/0399445 A1* | 12/2022 | Guler | H10D 64/258 |

OTHER PUBLICATIONS

Weckx, P., et al., "Novel Forksheet Device Architecture As Ultimate Logic Scaling Device Towards 2nm," IEEE; 4 pages (2019).

* cited by examiner

*Primary Examiner* — Xia L Cross
(74) *Attorney, Agent, or Firm* — Akona IP PC

(57) ABSTRACT

IC structures with nanoribbon stacks without dielectric protection caps for top nanoribbons, and associated methods and devices, are disclosed. An example IC structure includes a stack of nanoribbons, an opening over the top nanoribbon of the stack of nanoribbons, and a gate electrode material in the opening, where the opening has a first portion, a second portion, and a third portion, the second portion is between the first portion and the third portion, and where a width of a portion of the gate electrode material in the second portion is smaller than a width of a portion of the gate electrode material in the first portion. In such an IC structure, a gate insulator on the sidewalls of the first portion of the opening is materially discontinuous from a gate insulator on the sidewalls of the third portion of the opening.

20 Claims, 17 Drawing Sheets

2200
2268
2254
2256
2256
2257
2252
2260
2272
2266
2274
2258
2261
2265
2263
2262
2264
2270

NANORIBBON STACKS WITHOUT DIELECTRIC PROTECTION CAPS FOR TOP NANORIBBONS

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each contact becomes increasingly significant. Careful design of transistors may help with such optimization.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
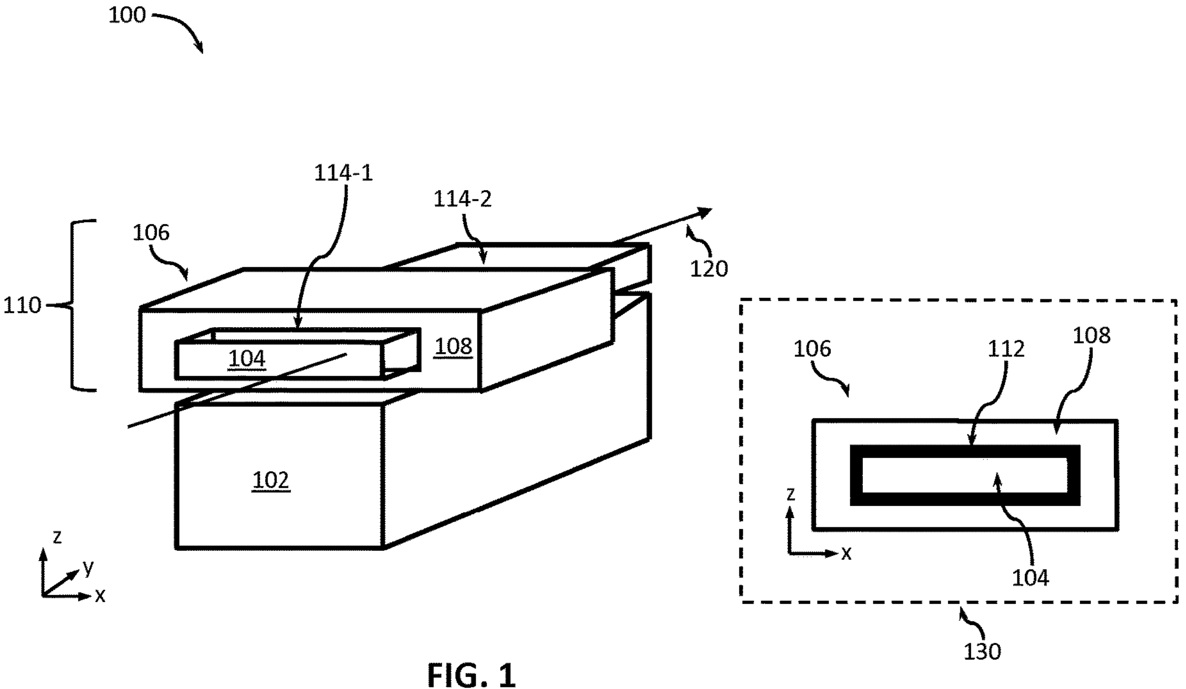
FIG. 1 provides a perspective view of an example IC device implementing a nanoribbon transistor, in accordance with some embodiments.

Disclosed herein are IC structures/devices with nanoribbon stacks without dielectric protection caps for top nanoribbons, and related methods and devices. The systems, methods, and devices of this disclosure each have several innovative aspects, no single one of which is solely responsible for all the desirable attributes disclosed herein. Details of one or more implementations of the subject matter described in this specification are set forth in the description below and the accompanying drawings.

For purposes of illustrating IC devices with nanoribbon stacks without dielectric protection caps for top nanoribbons, proposed herein, it might be useful to first understand phenomena that may come into play in such arrangements. The following foundational information may be viewed as a basis from which the present disclosure may be properly explained. Such information is offered for purposes of explanation only and, accordingly, should not be construed in any way to limit the broad scope of the present disclosure and its potential applications.

A field-effect transistor (FET), e.g., a metal-oxide-semiconductor (MOS) FET (MOSFET), is a three-terminal device that includes source, drain, and gate terminals and uses electric field to control current flowing through the device. A FET typically includes a semiconductor channel material, a source region and a drain region provided in the channel material, and a gate stack that includes at least a gate electrode material and, optionally, may also include a gate insulator, where the gate stack is provided over a portion of the channel material between the source region and the drain region.

Recently, FETs with non-planar architectures, such as nanoribbon transistors (also sometimes referred to as "gate all-around (GAA) transistors"), have been extensively explored as alternatives to transistors with planar architectures. In a nanoribbon transistor, a gate stack may be provided around a portion of an elongated semiconductor structure called "nanoribbon", forming a gate on all sides of the nanoribbon. The "channel" or the "channel portion" of a nanoribbon transistor is the portion of the nanoribbon around which the gate stack wraps. Such transistors are sometimes referred to as "GAA transistors" because, in use, such transistors may form conducting channels on all "sides" of the channel portion of the nanoribbon. A source region and a drain region are provided in the nanoribbon on each side of the gate stack, forming, respectively, a source and a drain of a nanoribbon transistor. In some settings, the term "nanoribbon" has been used to describe an elongated semiconductor structure that has a substantially rectangular transverse cross-section (i.e., a cross-section in a plane perpendicular to the longitudinal axis of the structure), while the term "nanowire" has been used to describe a similar structure but with a substantially circular or square transverse cross-sections. In the following, a single term "nanoribbon transistor" is used to describe all non-planar transistors where a gate stack wraps around substantially all sides of an elongated semiconductor structure, independent of the shape of the transverse cross-section. Thus, as used herein, the term "nanoribbon transistor" is used to cover transistors with elongated semiconductor structures that have substantially rectangular transverse cross-sections (possibly with rounded corners), transistors with elongated semiconductor structures that have substantially square transverse cross-sections (possibly with rounded corners), transistors with elongated semiconductor structures that have substantially circular or elliptical/oval transverse cross-sections, as well as transistors with elongated semiconductor structures that have any polygonal transverse cross-sections.

Nanoribbon architecture is particularly advantageous when multiple nanoribbons are stacked above one another and transistors are formed based on different nanoribbons of the stack, the transistors also being stacked above one another. During fabrication of an IC structure with a stack of such nanoribbon transistors, a dielectric protection cap is provided over the top nanoribbon of the stack in order to protect the gate stack of a transistor of the top nanoribbon from subsequent fabrication processes. In contrast to such conventional implementations, embodiments of the present disclosure provide IC structures without the dielectric protection cap over the top nanoribbon of the stack. In particular, IC structures presented herein are fabricated using a novel fabrication method where the dielectric protection cap over the top nanoribbon of the stack is kept until deposition and patterning of a gate insulator for the stack of nanoribbons is done, and then removed before the gate electrode material and, if used, the work function metal, are deposited. Such a fabrication method allows maintaining the integrity of the gate stack of the transistor(s) of the top nanoribbon while reducing the gate height parasitic capacitance that would otherwise be associated with the dielectric protection cap over the top nanoribbon of the stack. As a result of using the fabrication method described herein, final IC structures have certain unique features that differentiate them from conventional IC structures implementing nanoribbon stacks. For example, in one aspect, an IC structure fabricated using the method described herein may include a stack of nanoribbons and an opening over the top nanoribbon of the stack of nanoribbons, the opening comprising a first portion, a second portion, and a third portion, where the first portion is closer to the base than the second portion, the second portion is closer to the base than the third portion, and a gate insulator is on sidewalls of the first portion and the third portion and is absent from sidewalls of the second portion (i.e., the gate insulator on the sidewalls of the first portion is materially discontinuous from the gate insulator on the sidewalls of the third portion). In another aspect, an IC structure fabricated using the method described herein may include a stack of nanoribbons, an opening over the top nanoribbon of the stack of nanoribbons, and a gate electrode material in the opening, where the opening has a first portion, a second portion, and a third portion, the second portion is between the first portion and the third portion, and where a width of a portion of the gate electrode material in the second portion is smaller than a width of a portion of the gate electrode material in the first portion. In such an IC structure, a gate insulator on the sidewalls of the first portion of the opening is materially discontinuous from a gate insulator on the sidewalls of the third portion of the opening. The IC structures may further include a support structure (or, simply "support") such as a substrate, a die, a wafer, or a chip, where the stack of nanoribbons may be provided over the support structure.

Nanoribbon transistors as described herein, in particular nanoribbon transistors included in nanoribbon stacks without dielectric protection caps for top nanoribbons, may be included in one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on an IC or those connected to an IC. The IC may be either analog or digital and may be used in a number of applications, such as microprocessors, optoelectronics, logic blocks, audio amplifiers, etc., depending on the components associated with the IC. In some embodiments, IC devices as described herein may be included in a radio frequency IC (RFIC), which may, e.g., be included in any component associated with an IC of an RF receiver, an RF transmitter, or an RF transceiver, e.g., as used in telecommunications within base stations (BS) or user equipment (UE). Such components may include, but are not limited to, power amplifiers, low-noise amplifiers, RF filters (including arrays of RF filters, or RF filter banks), switches, upconverters, downconverters, and duplexers. In some embodiments, IC devices as described herein may be included in memory devices or circuits. In some embodiments, IC devices as described herein may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

In the following detailed description, various aspects of the illustrative implementations may be described using terms commonly employed by those skilled in the art to convey the substance of their work to others skilled in the art. For example, in context of source/drain (S/D) regions of a transistor, the term "region" may be used interchangeably with the terms "contact" and "terminal" of a transistor. In another example, as used herein, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," "sulfide," etc. refer to compounds containing, respectively, oxygen, carbon, nitrogen, sulfur, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20%, e.g., within +/−5% or within +/−2%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. To not clutter the drawings, if multiple instances of certain elements are illustrated, only some of the elements may be labeled with a reference sign. A plurality of drawings with the same number and different letters may be referred to without the letters, e.g., FIGS. 3A-3J may be referred to as "FIG. 3."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using, e.g., Physical Failure Analysis (PFA) would allow determination of presence of nanoribbon stacks without dielectric protection caps for top nanoribbons as described herein.

FIG. 1 provides a perspective view of an example IC device 100 implementing a nanoribbon transistor 110, in accordance with some embodiments. The nanoribbon transistor 110 is one example of a transistor that may be included in a nanoribbon stack without a dielectric protection cap for the top nanoribbon as described herein. While FIG. 1 illustrates only one nanoribbon 104 and only one nanoribbon transistor 110, embodiments of the present disclosure are applicable to multiple nanoribbons 104, e.g., arranged in stacks (e.g., as shown in FIG. 3), multiple stacks of nanoribbons 104, and/or multiple nanoribbon transistors 110 provided along a given nanoribbon 104.

Turning to the details of FIG. 1, the IC device 100 may include a semiconductor material, which may include one or more semiconductor materials, formed as a nanoribbon 104 (i.e., an elongated semiconductor structure) extending substantially parallel to a support structure 102. The transistor 110 may be formed on the basis of the nanoribbon 104 by having a gate stack 106 at least partially wrap around a portion of the nanoribbon referred to as a "channel portion" and by having source and drain regions, shown in FIG. 1 as a first S/D region 114-1 and a second S/D region 114-2, on either side of the gate stack 106. In some embodiments, a layer of oxide material (not specifically shown in FIG. 1) may be provided between the support structure 102 and the gate stack 106.

The IC device 100 shown in FIG. 1, as well as IC devices shown in other drawings of the present disclosure, is intended to show relative arrangements of some of the components therein, and the IC device 100, or portions thereof, may include other components that are not illustrated (e.g., electrical contacts to the S/D regions 114 of the transistor 110, additional layers such as a spacer layer around the gate stack 106 of the transistor 110, etc.). For example, although not specifically illustrated in FIG. 1, a dielectric spacer may be provided between a first S/D contact that may be coupled to a first S/D region 114-1 of the transistor 110 and the gate stack 106 as well as between a second S/D contact that may be coupled to a second S/D region 114-2 of the transistor 110 and the gate stack 106 in order to provide electrical isolation between the source, gate, and drain contacts (in general, "contacts" described herein may also be referred to as "electrodes"). In another example, although not specifically illustrated in FIG. 1, at least portions of the transistor 110 may be surrounded in an insulator material, such as any suitable interlayer dielectric (ILD) material. In some embodiments, such an insulator material may be a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In other embodiments, the insulator material surrounding portions of the transistor 110 may be a low-k dielectric material. Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass.

Implementations of the present disclosure may be formed or carried out on any suitable support structure 102, such as a substrate, a die, a wafer, or a chip. The support structure 102 may, e.g., be the wafer 2000 of FIG. 4, discussed below, and may be, or be included in, a die, e.g., the singulated die 2002 of FIG. 4, discussed below. The support structure 102 may be a semiconductor substrate composed of semiconductor material systems including, for example, N-type or P-type materials systems. In one implementation, the semiconductor substrate may be a crystalline substrate formed using a bulk silicon or a semiconductor-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and VI of the periodic system of elements), or group IV materials (i.e., materials from group IV of the periodic system of elements). In some embodiments, the substrate may be non-crystalline. In some embodiments, the support structure 102 may be a printed circuit board (PCB) substrate. Although a few examples of materials from which the support structure 102 may be formed are described here, any material that may serve as a foundation upon which an IC device with a nanoribbon stack without a dielectric protection cap for the top nanoribbon as described herein may be built falls within the spirit and scope of the present disclosure. As used herein, the term "support structure" does not necessarily mean that it provides mechanical support for the IC devices/structures (e.g., transistors, capacitors, interconnects, and so on) built thereon. For example, some other structure (e.g., a carrier substrate or a package substrate) may provide such mechanical support and the support structure may provide material "support" in that, e.g., the IC devices/structures described herein are built based on the semiconductor materials of the support structure. However, in some embodiments, the support structure of the IC devices described herein may provide mechanical support.

The nanoribbon 104 may take the form of a nanowire or nanoribbon, for example. In some embodiments, an area of a transverse cross-section of the nanoribbon 104 (i.e., an area in the x-z plane of the example coordinate system x-y-z shown in FIG. 1) may be between about 25 and 10000 square nanometers, including all values and ranges therein (e.g., between about 25 and 1000 square nanometers, or between about 25 and 500 square nanometers). The transverse cross-section of the nanoribbon 104 is a cross-section along a plane perpendicular to a longitudinal axis 120 of the nanoribbon 104, where the longitudinal axis 120 may, e.g., be along the y-axis of the example coordinate system shown in FIG. 1. In some embodiments, a width of the nanoribbon 104 (i.e., a dimension measured in a plane parallel to the support structure 102 and in a direction perpendicular to the longitudinal axis 120, e.g., along the x-axis of the example coordinate system shown in FIG. 1) may be at least about 3 times larger than a thickness (or a "height") of the nanoribbon 104 (i.e., a dimension measured in a plane perpendicular to the support structure 102, e.g., along the z-axis of the example coordinate system shown in FIG. 1), including all values and ranges therein, e.g., at least about 4 times larger, or at least about 5 times larger.

Although the nanoribbon 104 illustrated in FIG. 1 is shown as having a rectangular cross-section, the nanoribbon 104 may instead have a cross-section that is rounded at corners or otherwise irregularly shaped, and the gate stack 106 may conform to the shape of the nanoribbon 104. The terms "front face" and "back face" of a nanoribbon may refer to the faces of the nanoribbon 104 that are substantially parallel to the support structure 102, the term "sidewall" (or "side face") of a nanoribbon may refer to the opposing faces of the nanoribbon 104 that are substantially perpendicular to the support structure 102 and extend in a direction of the longitudinal axis 120 of the nanoribbon 104, while the term "end" of a nanoribbon may refer to the opposing faces of the nanoribbon 104 that are substantially perpendicular to the longitudinal axis 120 of the nanoribbon 104.

The nanoribbon 104 may be formed of one or more semiconductor materials, together referred to as a "channel material." In general, channel materials of any of the nanoribbon transistors described herein, e.g., the channel material of the transistor 110, may be composed of semiconductor material systems including, for example, N-type or P-type material systems. In some embodiments, the channel material may include a substantially monocrystalline semiconductor, such as silicon (Si) or germanium (Ge). In some embodiments, the channel material may include a compound semiconductor with a first sub-lattice of at least one element from group III of the periodic table (e.g., Al, Ga, In), and a second sub-lattice of at least one element of group V of the periodic table (e.g., P, As, Sb). In some embodiments, the channel material may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material may include a combination of semiconductor materials.

For some example N-type transistor embodiments (i.e., for the embodiments where the transistor in which the channel material is included is an N-type metal-oxide-semiconductor (NMOS) transistor), the channel material may include a III-V material having a relatively high electron mobility, such as, but not limited to InGaAs, InP, InSb, and InAs. For some such embodiments, the channel material may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). For some example P-type transistor embodiments (i.e., for the embodiments where the transistor in which the channel material is included is a P-type metal-oxide-semiconductor (PMOS) transistor), the channel material may advantageously be a group IV material having a high hole mobility, such as, but not limited to Ge or a Ge-rich SiGe alloy. For some example embodiments, the channel material may have a Ge content between 0.6 and 0.9, and advantageously may be at least 0.7.

In some embodiments, the channel material may be a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the channel material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc.

As noted above, the channel material may include IGZO. IGZO-based devices have several desirable electrical and manufacturing properties. IGZO has high electron mobility compared to other semiconductors, e.g., in the range of 20-50 times that of amorphous silicon. Furthermore, amorphous IGZO (a-IGZO) transistors are typically characterized by high band gaps, low-temperature process compatibility, and low fabrication cost relative to other semiconductors. IGZO can be deposited as a uniform amorphous phase while retaining higher carrier mobility than oxide semiconductors such as zinc oxide. Different formulations of IGZO include different ratios of indium oxide, gallium oxide, and zinc oxide. One particular form of IGZO has the chemical formula $InGaO_3(ZnO)_5$. Another example form of IGZO has an indium:gallium:zinc ratio of 1:2:1. In various other examples, IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10). IGZO can also contain tertiary dopants such as aluminum or nitrogen.

In some embodiments, any of the nanoribbon transistors described herein, e.g., the transistor 110, may be a thin-film transistor (TFT). A TFT is a special kind of a FET made by depositing active semiconductor material over a support (e.g., a support structure as described above) that may be a non-conducting support. Some such materials may be deposited at relatively low temperatures, which allows depositing them within the thermal budgets imposed on back-end fabrication to avoid damaging the front-end components such as the logic devices of an IC device in which the transistor may be included. Thus, in some embodiments, the channel material of any of the nanoribbon transistors described herein, e.g., the transistor 110, may be a semiconductor material deposited at relatively low temperatures, and may include any of the oxide semiconductor materials described above.

In other embodiments, instead of being deposited at relatively low temperatures as described above with reference to the TFTs, the channel material of any of the nanoribbon transistors described herein, e.g., the transistor 110, may be epitaxially grown in what typically involves relatively high-temperature processing. In such embodiments, the channel material may include any of the semiconductor materials described above, including oxide semiconductor materials. In some such embodiments, the channel material may be epitaxially grown directly on a semiconductor layer of a support structure over which the transistor will be fabricated, in a process known as "monolithic integration." In other such embodiments, the channel material of any of the nanoribbon transistors described herein, e.g., the transistor 110, may be epitaxially grown on a semiconductor layer of another support structure and then the epitaxially grown layer of the channel material may be transferred, in a process known as a "layer transfer," to a support structure over which the transistor will reside, in which case the latter support structure may but does not have to include a semiconductor layer prior to the layer transfer. Layer transfer advantageously allows forming non-planar transistors, such as FinFETs or nanoribbon transistors, over support structures or in layers that do not include semiconductor materials (e.g., in the back-end of an IC device). Layer transfer also advantageously allows forming transistors of any architecture (e.g., non-planar or planar transistors) without imposing the negative effects of the relatively high-temperature epitaxial growth process on devices that may already be present over a support structure.

A channel material that is deposited at relatively low temperatures is typically a polycrystalline, polymorphous, or amorphous semiconductor, or any combination thereof. A channel material that is epitaxially grown is typically a highly crystalline (e.g., monocrystalline or single-crystalline) material. Therefore, whether the channel material of any of the nanoribbon transistors described herein, e.g., the transistor 110, is deposited at relatively low temperatures or epitaxially grown can be identified by inspecting the grain size of the active portions of the channel material (e.g., of the portions of the channel material that form channels of transistors). An average grain size of a channel material of any of the nanoribbon transistors described herein, e.g., the transistor 110, being between about 0.5 and 1 millimeters (in which case the material may be polycrystalline) or smaller than about 0.5 millimeter (in which case the material may be polymorphous or amorphous) may be indicative of the channel material having been deposited (e.g., in which case the transistors in which such a channel material is included are TFTs). On the other hand, an average grain size of a channel material of any of the nanoribbon transistors described herein, e.g., the transistor 110, being equal to or greater than about 1 millimeter (in which case the material may be a single-crystal material) may be indicative of the channel material having been epitaxially grown and included in the final device either by monolithic integration or by layer transfer.

In some embodiments, the channel material of any of the nanoribbon transistors described herein, e.g., the transistor 110, may include a two-dimensional (2D) semiconductor material, i.e., a semiconductor material with a thickness of a few nanometers or less, where electrons in the material are free to move in the 2D plane but their restricted motion in the third direction is governed by quantum mechanics. In some such embodiments, such a channel material may include a single atomic monolayer of a 2D semiconductor material, while, in other such embodiments, such a channel material may include five or more atomic monolayers of a 2D semiconductor material. Examples of 2D materials that may be used to implement the channel material of any of the nanoribbon transistors described herein include, but are not limited to, graphene, hexagonal boron nitride, or transition-metal chalcogenides.

A gate stack 106 including a gate electrode material 108 and a gate insulator 112, may wrap entirely or almost entirely around a portion of the nanoribbon 104 as shown in FIG. 1, with the channel portion of the transistor 110 being the active region (channel region) of the channel material in the portion of the nanoribbon 104 wrapped by the gate stack 106. The gate insulator 112 is not shown in the perspective drawing of the IC device 100 shown in FIG. 1 but is shown in an inset 130 of FIG. 1, providing a cross-sectional side view of a portion of the nanoribbon 104 with a gate stack 106 wrapping around it. As shown in FIG. 1, the gate insulator 112 may wrap around a transversal portion/cross-section of the nanoribbon 104, and the gate electrode material 108 may wrap around the gate insulator 112.

The gate electrode material 108 may include at least one P-type work function metal or N-type work function metal, depending on whether the transistor 110 is a PMOS transistor or an NMOS transistor. P-type work function metal may be used as the gate electrode material 108 when the transistor 110 is a PMOS transistor and N-type work function metal may be used as the gate electrode material 108 when the transistor 110 is an NMOS transistor. For a PMOS transistor, metals that may be used for the gate electrode material 108 may include, but are not limited to, ruthenium, palladium, platinum, cobalt, nickel, and conductive metal oxides (e.g., ruthenium oxide). For an NMOS transistor, metals that may be used for the gate electrode material 108 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 108 may include a stack of two or more metal layers, where one or more metal layers are work function metal layers and at least one metal layer is a fill metal layer. Further layers may be included next to the gate electrode material 108 for other purposes, such as to act as a diffusion barrier layer or/and an adhesion layer.

In some embodiments, the gate insulator 112 may include one or more high-k dielectrics including any of the materials discussed herein with reference to the insulator material that may surround portions of the transistor 110. In some embodiments, an annealing process may be carried out on the gate insulator 112 during manufacture of the transistor 110 to improve the quality of the gate insulator 112. The gate insulator 112 may have a thickness that may, in some embodiments, be between about 0.5 nanometers and 3 nanometers, including all values and ranges therein (e.g., between about 1 and 3 nanometers, or between about 1 and 2 nanometers), although, in other embodiments, the thickness of the gate insulator 112 may be greater than 3 nanometers. In some embodiments, the gate stack 106 may be surrounded by a gate spacer, not shown in FIG. 1. Such a gate spacer would be configured to provide separation between the gate stack 106 and source/drain contacts of the transistor 110 and could be made of a low-k dielectric material, some examples of which have been provided above. A gate spacer may include pores or air gaps to further reduce its dielectric constant.

In some embodiments, the gate insulator 112 may include a hysteretic material or a hysteretic arrangement, which, together, may be referred to as a "hysteretic element." Transistors 110 in which the gate insulator 112 includes a hysteretic element may be described as "hysteretic transistors" and may be used to implement hysteretic memory. Hysteretic memory refers to a memory technology employing hysteretic materials or arrangements, where a material or an arrangement may be described as hysteretic if it exhibits the dependence of its state on the history of the material (e.g., on a previous state of the material). Ferroelectric (FE) and antiferroelectric (AFE) materials are examples of hysteretic materials. Layers of different materials arranged in a stack to exhibit charge-trapping phenomena is an example of a hysteretic arrangement.

A FE or an AFE material is a material that exhibits, over some range of temperatures, spontaneous electric polarization, i.e., displacement of positive and negative charges from their original position, where the polarization can be reversed or reoriented by application of an electric field. In particular, an AFE material is a material that can assume a state in which electric dipoles from the ions and electrons in the material may form a substantially ordered (e.g., substantially crystalline) array, with adjacent dipoles being oriented in opposite (antiparallel) directions (i.e., the dipoles of each orientation may form interpenetrating sub-lattices, loosely analogous to a checkerboard pattern), while a FE material is a material that can assume a state in which all of the dipoles point in the same direction. Because the displacement of the charges in FE and AFE materials can be maintained for some time even in the absence of an electric field, such materials may be used to implement memory cells. Because the current state of the electric dipoles in FE and AFE materials depends on the previous state, such materials are hysteretic materials. Memory technology where logic states are stored in terms of the orientation of electric dipoles in (i.e., in terms of polarization of) FE or AFE materials is referred to as "FE memory," where the term "ferroelectric" is said to be adopted to convey the similarity of FE memories to ferromagnetic memories, even though there is typically no iron (Fe) present in FE or AFE materials.

A stack of alternating layers of materials that is configured to exhibit charge-trapping is an example of a hysteretic arrangement. Such a stack may include as little as two layers of materials, one of which is a charge-trapping layer (i.e., a layer of a material configured to trap charges when a voltage is applied across the material) and the other one of which is a tunneling layer (i.e., a layer of a material through which the charge is to be tunneled to the charge-trapping layer). The tunneling layer may include an insulator material such as a material that includes silicon and oxygen (e.g., silicon oxide), or any other suitable insulator. The charge-trapping layer may include a metal or a semiconductor material that is configured to trap charges. Because the trapped charges may be kept in a charge-trapping arrangement for some time even in the absence of an electric field, such arrangements may be used to implement memory cells. Because the presence and/or the number of trapped charges in a charge-trapping arrangement depends on the previous state, such arrangements are hysteretic arrangements. Memory technology where logic states are stored in terms of the amount of charge trapped in a hysteretic arrangement may be referred to as "charge-trapping memory."

Hysteretic memories have the potential for adequate non-volatility, short programming time, low power consumption, high endurance, and high-speed writing. In addition, hysteretic memories may be manufactured using processes compatible with the standard complementary metal-oxide-semiconductor (CMOS) technology. Therefore, over the last few years, these types of memories have emerged as promising candidates for many growing applications.

In some embodiments, the hysteretic element of the gate insulator 112 may be provided as a layer of a FE or an AFE material. Such an FE/AFE material may include one or more materials that can exhibit sufficient FE/AFE behavior even at thin dimensions, e.g., such as an insulator material at least about 5%, e.g., at least about 7% or at least about 10%, of which is in an orthorhombic phase and/or a tetragonal phase (e.g., as a material in which at most about 95-90% of the material may be amorphous or in a monoclinic phase). For example, such materials may be based on hafnium and oxygen (e.g., hafnium oxides), with various dopants added to ensure a sufficient amount of an orthorhombic phase or a tetragonal phase. Some examples of such materials include materials that include hafnium, oxygen, and zirconium (e.g., hafnium zirconium oxide (HfZrO, also referred to as HZO)), materials that include hafnium, oxygen, and silicon (e.g., silicon-doped (Si-doped) hafnium oxide), materials that include hafnium, oxygen, and germanium (e.g., germanium-doped (Ge-doped) hafnium oxide), materials that include hafnium, oxygen, and aluminum (e.g., aluminum-doped (Al-doped) hafnium oxide), and materials that include hafnium, oxygen, and yttrium (e.g., yttrium-doped (Y-doped) hafnium oxide). However, in other embodiments, any other materials which exhibit FE/AFE behavior at thin dimensions may be used as the hysteretic element and are within the scope of the present disclosure.

In other embodiments, the hysteretic element of the gate insulator 112 may be provided as a stack of alternating layers of materials that can trap charges. In some such embodiments, the stack may be a two-layer stack, where one layer is a charge-trapping layer and the other layer is a tunneling layer. The tunneling layer may include an insulator material such as a material that includes silicon and oxygen (e.g., silicon oxide), or any other suitable insulator. The charge-trapping layer may include an electrically conductive material such as a metal, or a semiconductor material. In some embodiments, the charge-trapping layer may include a sub-stoichiometric material (i.e., a material that includes less than a stoichiometric amount of a reagent). The sub-stoichiometric material may include vacancies in a concentration of at least about $10^{18}$ vacancies per cubic centimeter, e.g., in concentration between about $10^{18}$ vacancies per cubic centimeter and about $10^{22}$-$10^{23}$ vacancies per cubic centimeter. As known in the art, vacancies refer to sites where atoms (e.g., oxygen or nitrogen) that should be present are missing, thus providing a defect in a material. For example, the sub-stoichiometric material of any of the hysteretic elements described herein may include oxygen and the vacancies may be oxygen vacancies, or the sub-stoichiometric material may include nitrogen and the vacancies may be nitrogen vacancies. During operation, charges may be trapped in the vacancies of the sub-stoichiometric material. Thus, implementing a sub-stoichiometric material with vacancies is one way to provide a charge-trapping layer of a hysteretic arrangement. In general, any material that has defects that can trap charge may be used in/as a charge-trapping layer. Such defects are very detrimental to the operation of logic devices and, therefore, typically, deliberate steps need to be taken to avoid the presence of the defects. However, for memory devices, such defects are desirable because charge-trapping may be used to represent different memory states of a memory cell.

In some embodiments of the hysteretic element being provided as a stack of alternating layers of materials that can trap charges, the stack may be a three-layer stack where an insulator material is provided on both sides of a charge-trapping layer. In such embodiments, a layer of an insulator material on one side of the charge-trapping layer may be referred to as a "tunneling layer" while a layer of an insulator material on the other side of the charge-trapping layer may be referred to as a "field layer."

In various embodiments of the hysteretic element being provided as a stack of alternating layers of materials that can trap charges, a thickness of each layer of the stack may be between about 0.5 and 10 nanometers, including all values and ranges therein, e.g., between about 0.5 and 5 nanometers. In some embodiment of a three-layer stack, a thickness of each layer of the insulator material may be about 0.5 nanometers, while a thickness of the charge-trapping layer may be between about 1 and 8 nanometers, e.g., between about 2.5 and 7.5 nanometers, e.g., about 5 nanometers. In some embodiments, a total thickness of the hysteretic element provided as a stack of alternating layers of materials that can trap charges (i.e., a hysteretic arrangement) may be between about 1 and 10 nanometers, e.g., between about 2 and 8 nanometers, e.g., about 6 nanometers.

Turning to the S/D regions 114 of the transistor 110, in some embodiments, the S/D regions may be highly doped, e.g., with dopant concentrations of about $10^{21}$ dopants per cubic centimeter, in order to advantageously form Ohmic contacts with the respective S/D electrodes, although these regions may also have lower dopant concentrations and may form Schottky contacts in some implementations. Irrespective of the exact doping levels, the S/D regions of a transistor may be the regions having dopant concentration higher than in other regions, e.g., higher than a dopant concentration in the channel portion (i.e., in a channel material extending between the first S/D region 114-1 and the second S/D region 114-2), and, therefore, may be referred to as "highly doped" (HD) regions. The channel portion of the transistor 110 may include semiconductor materials with doping concentrations significantly smaller than those of the S/D regions 114.

The S/D regions 114 of the transistor 110 may generally be formed using either an implantation/diffusion process or an etching/deposition process. In the former process, dopants such as boron, aluminum, antimony, phosphoros, or arsenic may be ion-implanted into the nanoribbon 104 to form the source and drain regions. An annealing process that activates the dopants and causes them to diffuse further into the nanoribbon 104 may follow the ion implantation process. In the latter process, portions of the nanoribbon 104 may first be etched to form recesses at the locations of the future S/D regions 114. An epitaxial deposition process may then be carried out to fill the recesses with material that is used to fabricate the S/D regions 114. In some implementations, the S/D regions 114 may be fabricated using a silicon alloy such as silicon germanium or silicon carbide. In some implementations, the epitaxially deposited silicon alloy may be doped in situ with dopants such as boron, arsenic, or phosphoros. In further embodiments, the S/D regions 114 may be formed using one or more alternate semiconductor materials such as germanium or a group III-V material or alloy. And in further embodiments, one or more layers of metal and/or metal alloys may be used to form the S/D regions 114. In some embodiments, a distance between the first and second S/D regions 114 (i.e., a dimension measured along the longitudinal axis 120 of the nanoribbon 104) may be between about 5 and 40 nanometers, including all values and ranges therein (e.g., between about 22 and 35 nanometers, or between about 20 and 30 nanometers).

Figure 2:
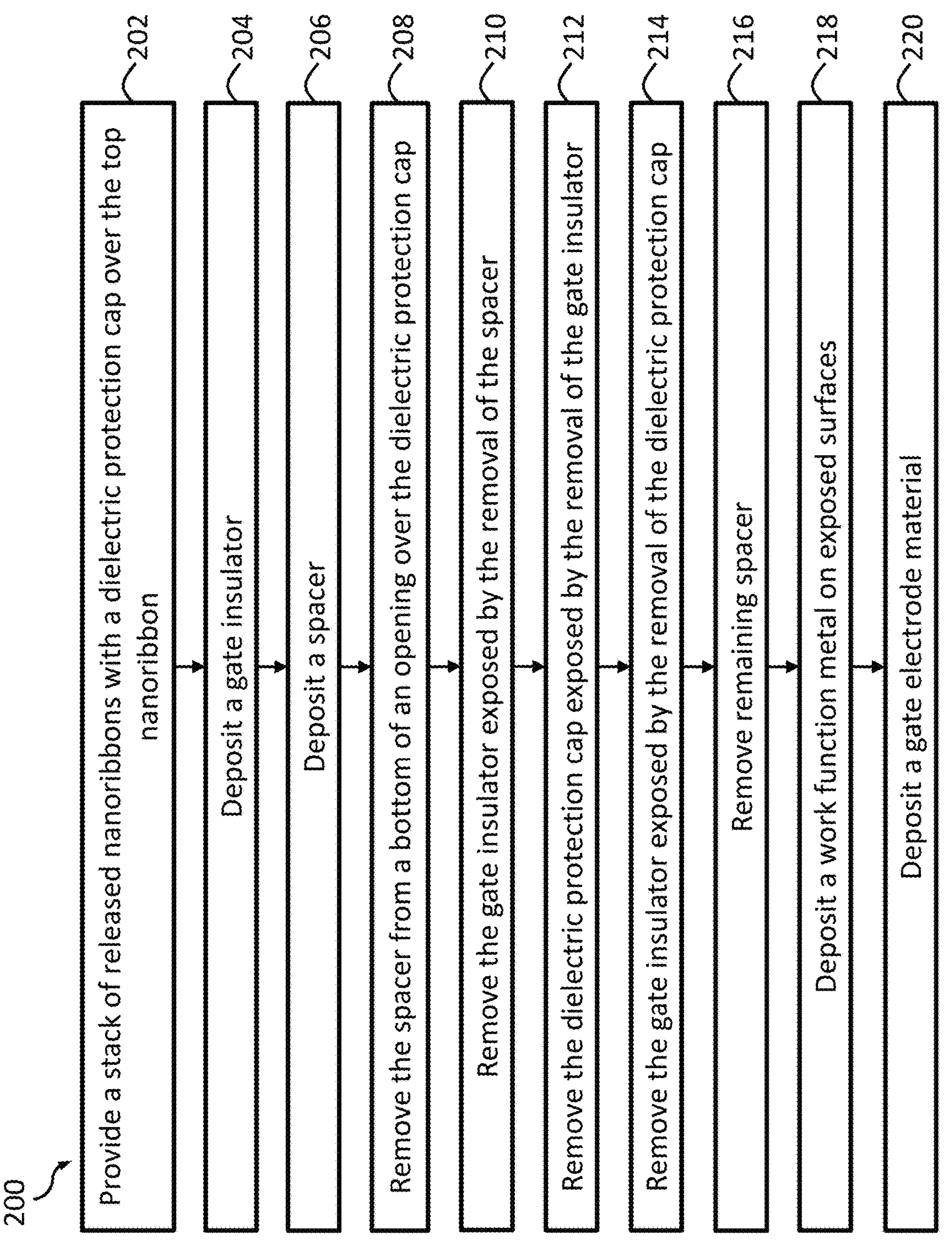
FIG. 2 is a flow diagram of an example method of manufacturing a nanoribbon stack without a dielectric protection cap for the top nanoribbon, in accordance with various embodiments.

FIG. 2 is a flow diagram of an example method 200 of manufacturing a nanoribbon stack without a dielectric protection cap for the top nanoribbon, in accordance with various embodiments. FIGS. 3A-3J illustrate cross-sectional side views of example IC structures after various processes of the method 200 of FIG. 2, in accordance with various embodiments. Some of the elements shown in FIGS. 3A-3J are referred to in the present description with reference numerals illustrated in these drawings with different patterns, with a legend showing the correspondence between the reference numerals and patterns being provided at the bottom of each drawing page of FIGS. 3A-3J. Although a certain number of a given element may be illustrated in FIGS. 3A-3J (e.g., a certain number of nanoribbons in a stack of nanoribbons), this is also simply for ease of illustration, and more, or less, than that number may be included in IC structures/devices according to various embodiments of the present disclosure.

Although the operations of the manufacturing method illustrated in FIG. 2 are illustrated once each and in a particular order, the operations may be performed in any suitable order and repeated as desired. For example, the operations may be performed in a different order to reflect the structure of an IC device in which a nanoribbon stack without a dielectric protection cap for the top nanoribbon will be included. In addition, the example manufacturing method illustrated in FIG. 2 may include other operations not specifically shown in the drawings, such as various cleaning or planarization operations as known in the art. For example, in some embodiments, a support structure, as well as layers of various other materials subsequently deposited thereon, may be cleaned prior to, after, or during any of the processes of the manufacturing method illustrated in FIG. 2, e.g., to remove oxides, surface-bound organic and metallic contaminants, as well as subsurface contamination. In some embodiments, cleaning may be carried out using, e.g., a chemical solution (such as peroxide), and/or ultraviolet (UV) radiation combined with ozone, and/or oxidizing the surface (e.g., using thermal oxidation) then removing the oxide (e.g., using hydrofluoric acid (HF)). In another example, the arrangements/devices described herein may be planarized prior to, after, or during any of the processes of the manufacturing method illustrated in FIG. 2 described herein, e.g., to remove overburden or excess materials. In some embodiments, planarization may be carried out using either wet or dry planarization processes, e.g., planarization may be a chemical mechanical planarization (CMP), which may be understood as a process that utilizes a polishing surface, an abrasive and a slurry to remove the overburden and planarize the surface.

Figure 3A:
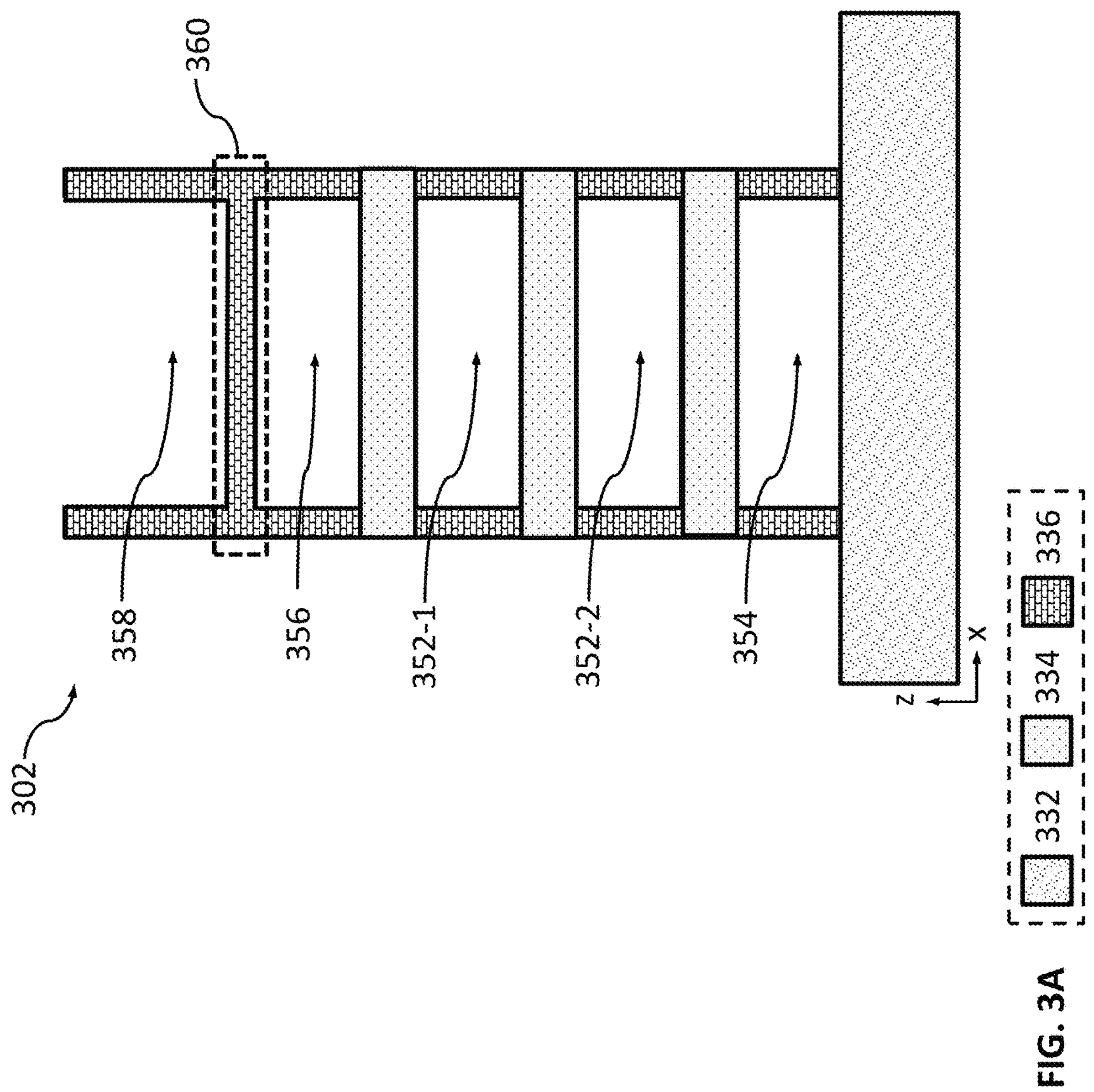
FIGS. 3A-3J illustrate cross-sectional side views of example IC structures after various processes of the method of FIG. 2, in accordance with various embodiments.

At 202, a stack of released nanoribbons with a dielectric protection cap over the top nanoribbon may be provided. An IC structure 302, depicted in FIG. 3A, illustrates an example result of the process 202. As shown in FIG. 3A, the IC structure 302 may include a support structure 332, and a plurality of nanoribbons 334 stacked above one another above the support structure 332. Each of the nanoribbons 334 may take the form of the nanoribbon 104 disclosed herein, while the support structure 332 may take the form of the support structure 102 disclosed herein. The nanoribbons 334 of the IC structure 302 are "released" in that materials in regions next to the top and bottom of each of the nanoribbons where gate stacks of future transistors are to be provided are etched away, so that channel regions of the future transistors of the nanoribbons 334 are exposed for further processing. Techniques for releasing nanoribbons of a stack of nanoribbons as a part of fabricating nanoribbon transistors are known in the art, and any of these techniques may be employed to perform the process 202. As a result of releasing the nanoribbons 334, various openings are formed, such as openings 352-1 and 352-2 between adjacent pairs of the nanoribbons 334, an opening 354 between the bottom nanoribbon 334 and the support structure 332, an opening 356 between the top nanoribbon 334 and a dielectric protection cap 360 above the top nanoribbon 334, and an opening 358 above the dielectric protection cap 360. As shown in FIG. 3A, in some embodiments, the dielectric protection cap 360 may be a portion of a structure of a dielectric material 336 that supports the released nanoribbons 334 and may, therefore, have the same material composition as the remainder of the structure (i.e., the same as the dielectric material 336). The dielectric material 336 may include any suitable dielectric material that can support the nanoribbons 334 and protect the nanoribbons 334 from the damaging effects of subsequent fabrication steps, e.g., those involving fabrication of the gate stacks around the nanoribbons 334. The dielectric material 336 may include any of the insulator materials described above, e.g., a material that includes silicon and nitrogen (e.g., silicon nitride).

Figure 3B:
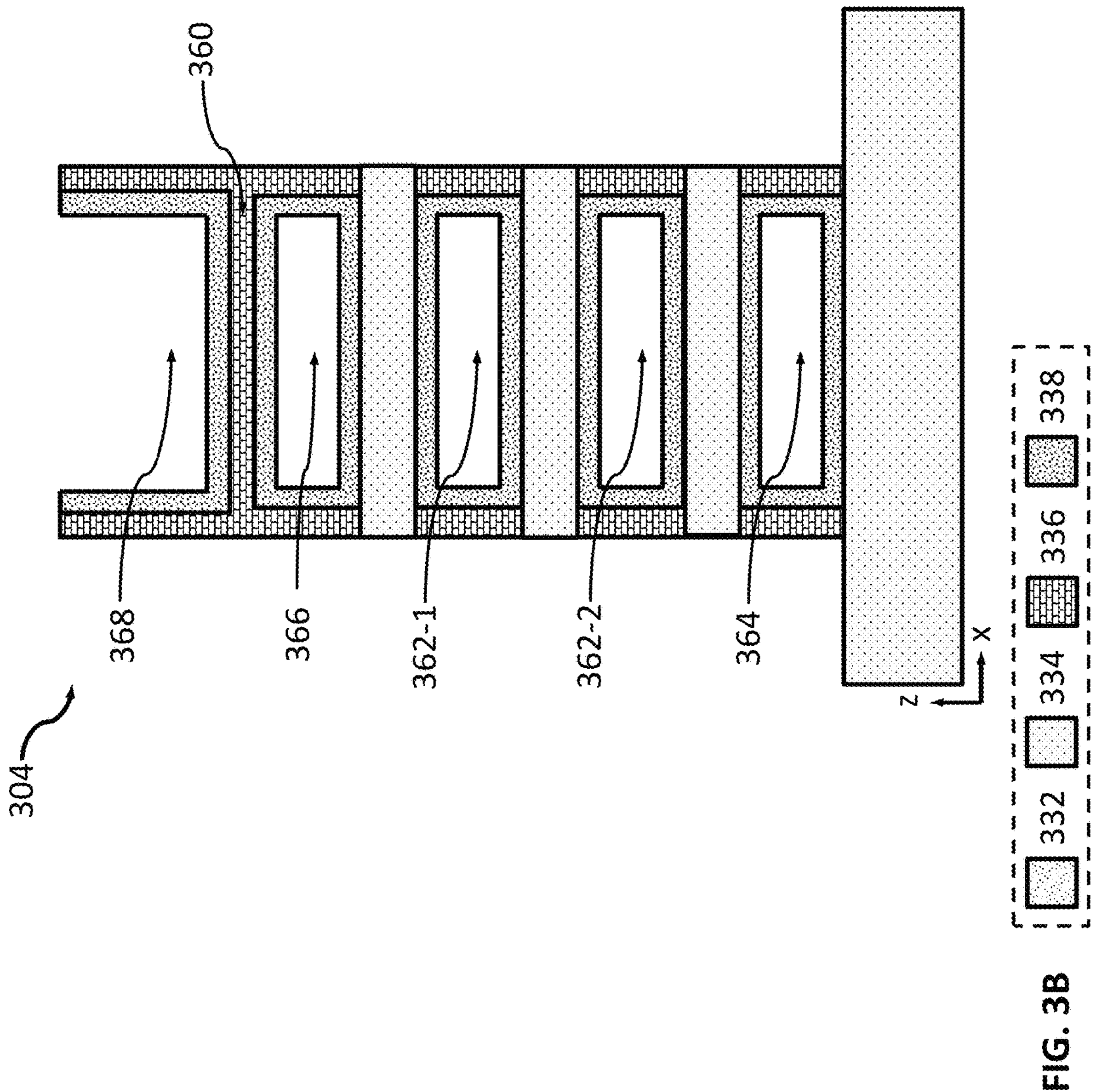

At 204, a gate insulator may be deposited in the openings 352, 354, 356, and 358. An IC structure 304, depicted in FIG. 3B, illustrates an example result of the process 204. As shown in FIG. 3B, the IC structure 304 may include a gate insulator 338 lining all exposed surfaces of the openings 352, 354, 356, and 358 that were formed at 202. As a result of depositing the gate insulator 338, the openings 352, 354, 356, and 358 become, respectively, gate insulator-lined openings 362, 364, 366, and 368. For example, the gate insulator-lined opening 362-1 is a result of depositing the gate insulator 338 in the opening 352-1 between a first pair of adjacent nanoribbons 334, the gate insulator-lined opening 362-2 is a result of depositing the gate insulator 338 in the opening 352-2 between a second pair of adjacent nanoribbons 334, the gate insulator-lined opening 364 is a result of depositing the gate insulator 338 in the opening 354 between the bottom nanoribbon 334 and the support structure 332, the gate insulator-lined opening 366 is a result of depositing the gate insulator 338 in the opening 356 between the top nanoribbon 334 and the dielectric protection cap 360, and the gate insulator-lined opening 368 is a result of depositing the gate insulator 338 in the opening 358 above the dielectric protection cap 360. The gate insulator 338 may take the form of the gate insulator 112 disclosed herein and may be provided at 204 using any suitable deposition techniques known in the art, such as atomic level deposition (ALD), chemical vapor deposition (CVD), or physical vapor deposition (PVD), possibly in combination with using suitable masks and/or various patterning techniques. In some embodiments, the gate insulator 338 may include an interface layer such as silicon oxide and a high-k dielectric on top of the nanoribbons 334, while the top and the sidewalls of the dielectric material 336 and/or the dielectric protection cap 360 may include only the high-k dielectric but not the interface layer.

Figure 3C:
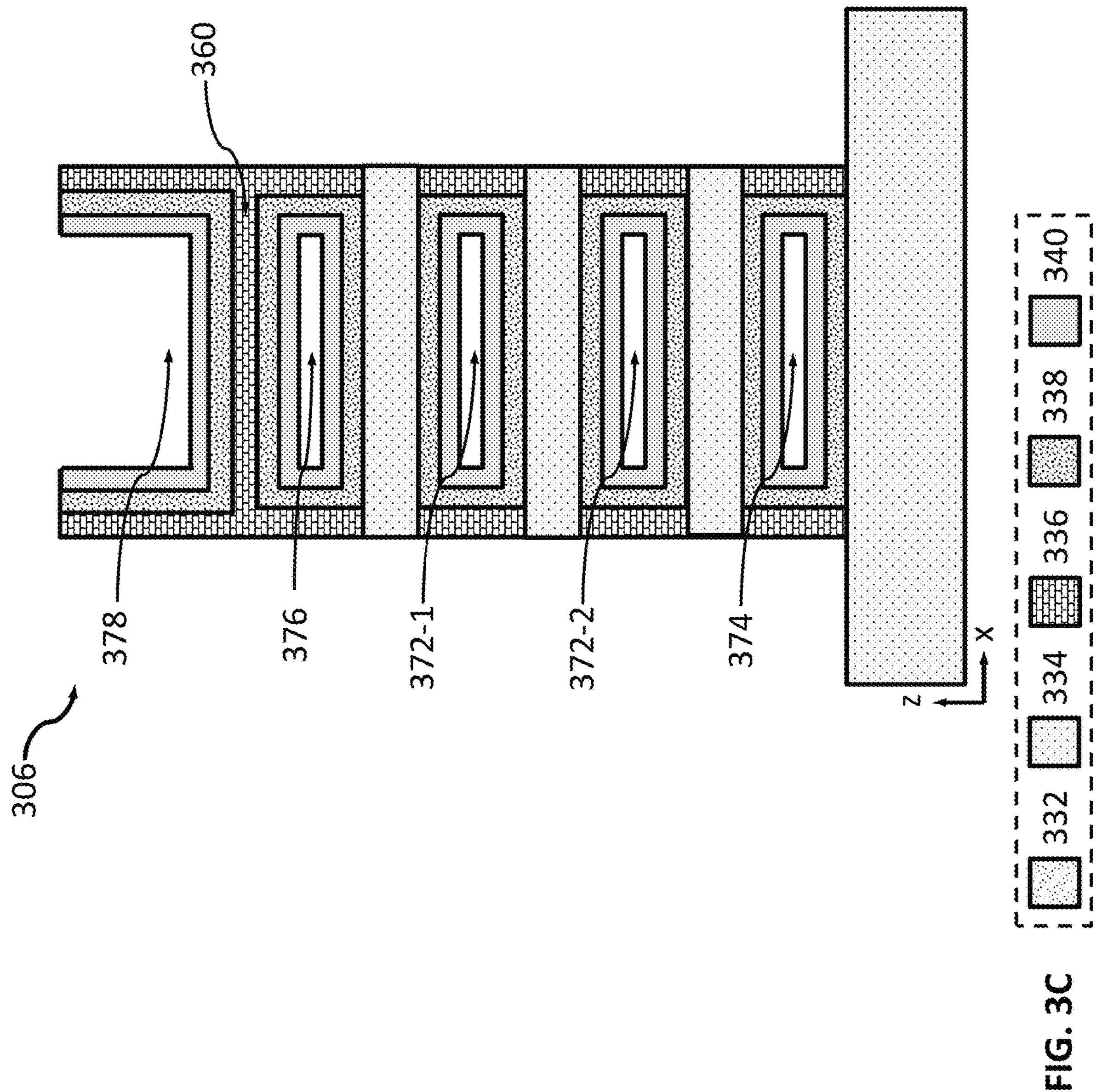

At 206, a spacer may be deposited in the gate insulator-lined openings 362, 364, 366, and 368. An IC structure 306, depicted in FIG. 3C, illustrates an example result of the process 206. As shown in FIG. 3C, the IC structure 306 may include a spacer 340 lining all exposed surfaces of the gate insulator-lined openings 362, 364, 366, and 368 that were formed at 204. As a result of depositing the spacer 340, the gate insulator-lined openings 362, 364, 366, and 368 become, respectively, spacer-lined openings 372, 374, 376, and 378. For example, the spacer-lined opening 372-1 is a result of depositing the spacer 340 in the gate insulator-lined opening 362-1 between a first pair of adjacent nanoribbons 334, the spacer-lined opening 372-2 is a result of depositing the spacer 340 in the gate insulator-lined opening 362-2 between a second pair of adjacent nanoribbons 334, the spacer-lined opening 374 is a result of depositing the spacer 340 in the gate insulator-lined opening 364 between the bottom nanoribbon 334 and the support structure 332, the spacer-lined opening 376 is a result of depositing the spacer 340 in the gate insulator-lined opening 366 between the top nanoribbon 334 and the dielectric protection cap 360, and the spacer-lined opening 378 is a result of depositing the spacer 340 in the gate insulator-lined opening 368 above the dielectric protection cap 360. The spacer 340 may include any suitable material that may be used for protecting certain areas of the IC structure from the etch processes of the subsequent steps of the method 200. For example, in some embodiments, the spacer 340 may include a material that includes titanium and nitrogen (e.g., titanium nitride). The spacer 340 may be provided at 206 using any suitable deposition techniques known in the art, such as ALD, CVD, PVD, or any other conformal deposition technique, possibly in combination with using suitable masks and/or various patterning techniques. A thickness of the spacer 340 provided at 206 may be between about 0.5 and 10 nanometers, e.g., between about 0.5 and 5 nanometers, e.g., between about 1 and 3 nanometers.

Figure 3D:
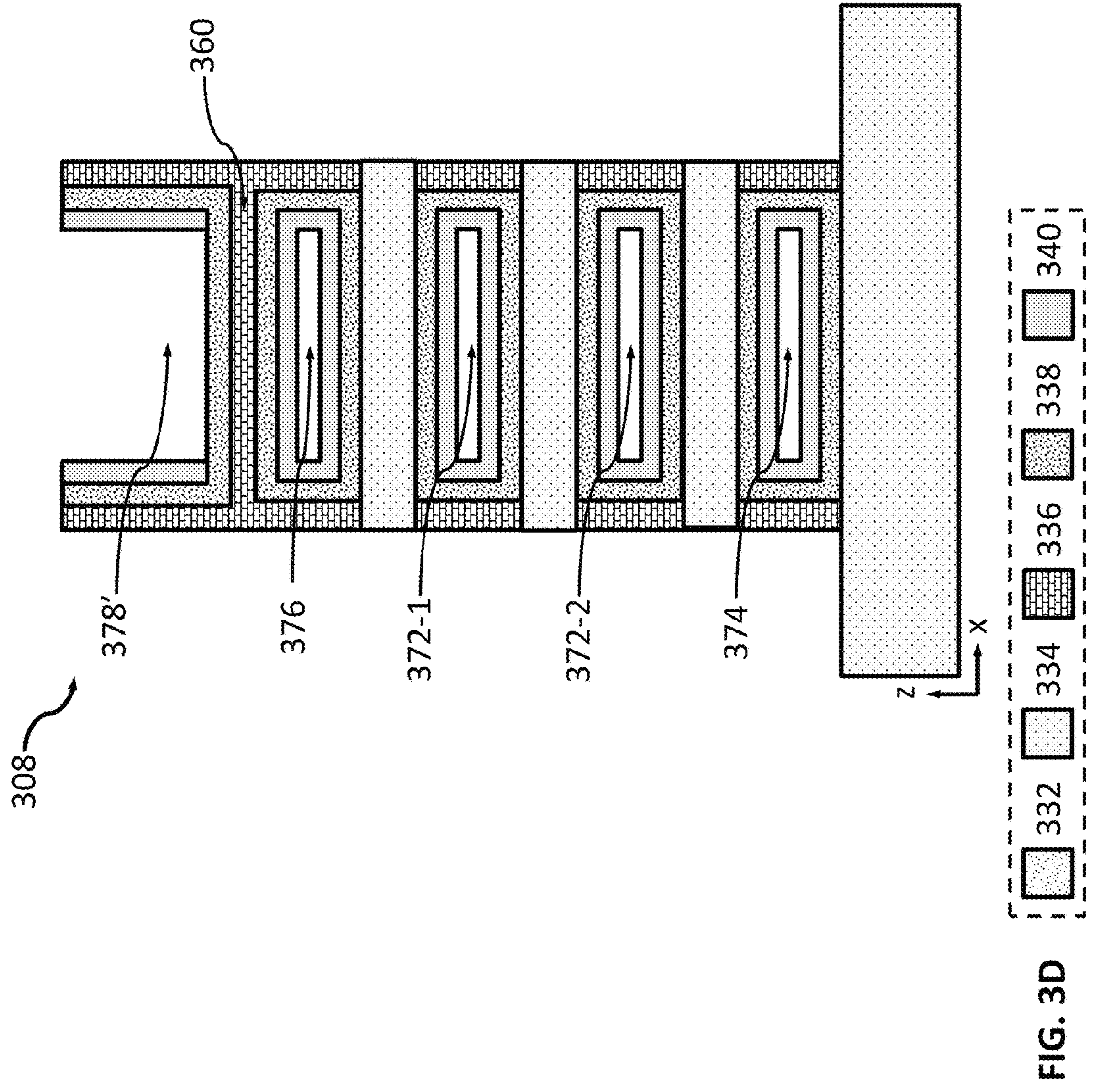

At 208, the spacer deposited at 206 may be removed from the bottom of the opening over the dielectric protection cap 360. An IC structure 308, depicted in FIG. 3D, illustrates an example result of the process 208. As shown in FIG. 3D, the IC structure 308 is substantially the same as the IC structure 306, except that the spacer 340 at the bottom of the spacer-lined opening 378 is removed, thus deepening the spacer-lined opening 378 so that the gate insulator 338 is exposed at the bottom, thereby turning the spacer-lined opening 378 into a first extended spacer-lined opening 378'. In order to remove the spacer 340 substantially only at the bottom of the spacer-lined opening 378 formed at 206, any suitable anisotropic etch techniques may be used, such as a dry etch, e.g., radio frequency (RF) reactive ion etch (RIE) or inductively coupled plasma (ICP) RIE. In some embodiments, the etch performed in the process 208 may include an anisotropic etch using etchants in a form of e.g., chemically active ionized gas (i.e., plasma) using e.g., bromine (Br) and chloride (CI) based chemistries. In some embodiments, during the etch of the process 208, the IC structure may be heated to elevated temperatures, e.g., to temperatures between about room temperature and 200 degrees Celsius, including all values and ranges therein, to promote that byproducts of the etch are made sufficiently volatile to be removed from the surface. FIG. 3D illustrates an embodiment where the gate insulator 338 exposed at the bottom of the first extended spacer-lined opening 378' is not substantially etched. This may be a result of careful timing of the etch of the process 208 and/or because the spacer 340 is sufficiently etch selective with respect to the gate insulator 338. As known in the art, two materials are said to have “sufficient etch selectivity” when etchants used to etch one material do not substantially etch the other, enabling etching of one material substantially without etching the other. For example, if the spacer 340 includes titanium nitride and the gate insulator 338 includes hafnium oxide, etchants used to etch the spacer 340 in the process 208 would not substantially etch the gate insulator 338.

Figure 3E:
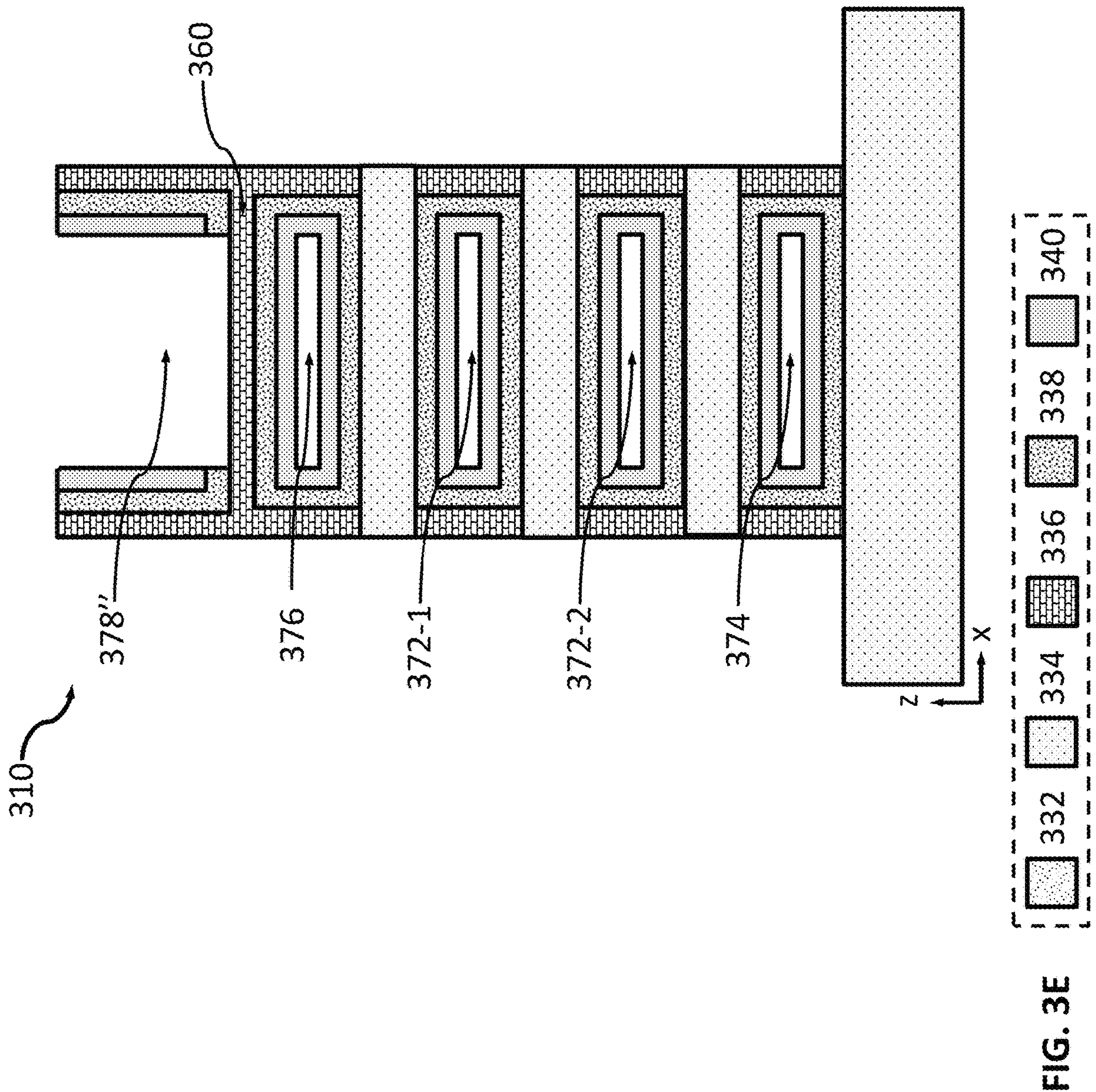

At 210, the gate insulator 338 exposed in the process 208 by the removal of the spacer 340 from the bottom of the opening over the dielectric protection cap 360 may be removed. An IC structure 310, depicted in FIG. 3E, illustrates an example result of the process 210. As shown in FIG. 3E, the IC structure 310 is substantially the same as the IC structure 308, except that the gate insulator 338 at the bottom of the first extended spacer-lined opening 378' is removed, thus deepening the first extended spacer-lined opening 378' so that the dielectric protection cap 360 is exposed at the bottom, thereby turning the first extended spacer-lined opening 378' into a second extended spacer-lined opening 378''. In order to remove the gate insulator 338 substantially only at the bottom of the first extended spacer-lined opening 378' formed at 208, any suitable anisotropic etch techniques may be used, such as any of the techniques described above. FIG. 3E illustrates an embodiment where the dielectric protection cap 360 exposed at the bottom of the second extended spacer-lined opening 378'' is not substantially etched. This may be a result of careful timing of the etch of the process 210 and/or because the gate insulator 338 is sufficiently etch selective with respect to the dielectric protection cap 360. For example, if the gate insulator 338 includes hafnium oxide and the dielectric protection cap 360 includes silicon nitride, etchants used to etch the gate insulator 338 in the process 210 would not substantially etch the dielectric protection cap 360.

Figure 3F:
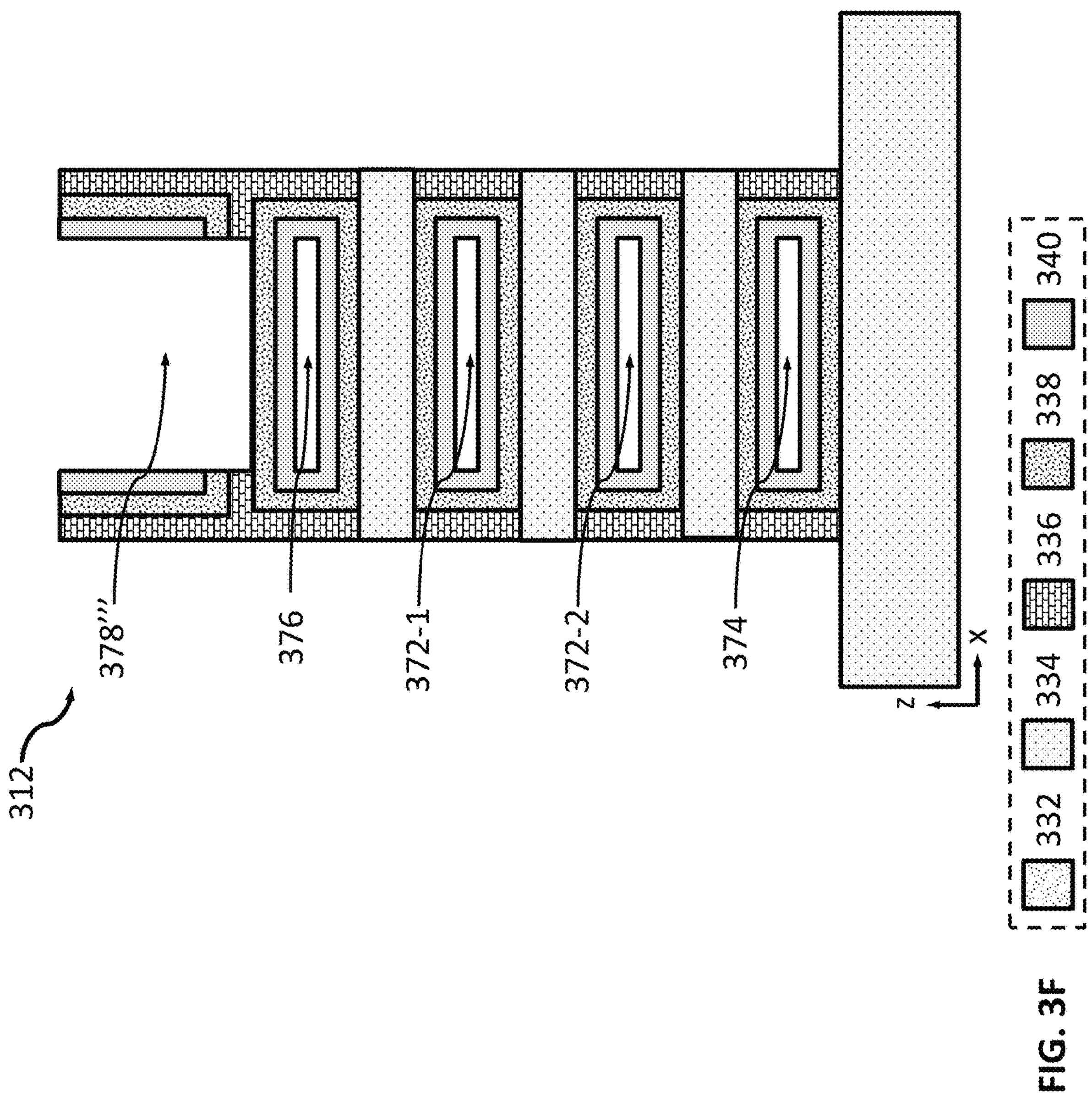

At 212, a portion of the dielectric protection cap 360 exposed in the process 210 by the removal of the gate insulator 338 from the bottom of the opening over the dielectric protection cap 360 may be removed. An IC structure 312, depicted in FIG. 3F, illustrates an example result of the process 212. As shown in FIG. 3F, the IC structure 312 is substantially the same as the IC structure 310, except that the portion of the dielectric protection cap 360 at the bottom of the second extended spacer-lined opening 378'' is removed, thus deepening the second extended spacer-lined opening 378'' further so that the dielectric protection cap 360 that was exposed at the bottom at 210 is removed, exposing the gate insulator 338 that was deposited in the opening 356, thereby turning the second extended spacer-lined opening 378'' into a third extended spacer-lined opening 378'''. In order to remove the dielectric protection cap 360 substantially only at the bottom of the second extended spacer-lined opening 378'' formed at 210, any suitable anisotropic etch techniques may be used, such as any of the techniques described above. FIG. 3F illustrates an embodiment where the gate insulator 338 that was deposited in the opening 356 and exposed at the bottom of the third extended spacer-lined opening 378''' is not substantially etched. This may be a result of careful timing of the etch of the process 212 and/or because the gate insulator 338 is sufficiently etch selective with respect to the dielectric protection cap 360. For example, if the gate insulator 338 includes hafnium oxide and the dielectric protection cap 360 includes silicon nitride, etchants used to etch the dielectric protection cap 360 in the process 212 would not substantially etch the gate insulator 338.

Figure 3G:
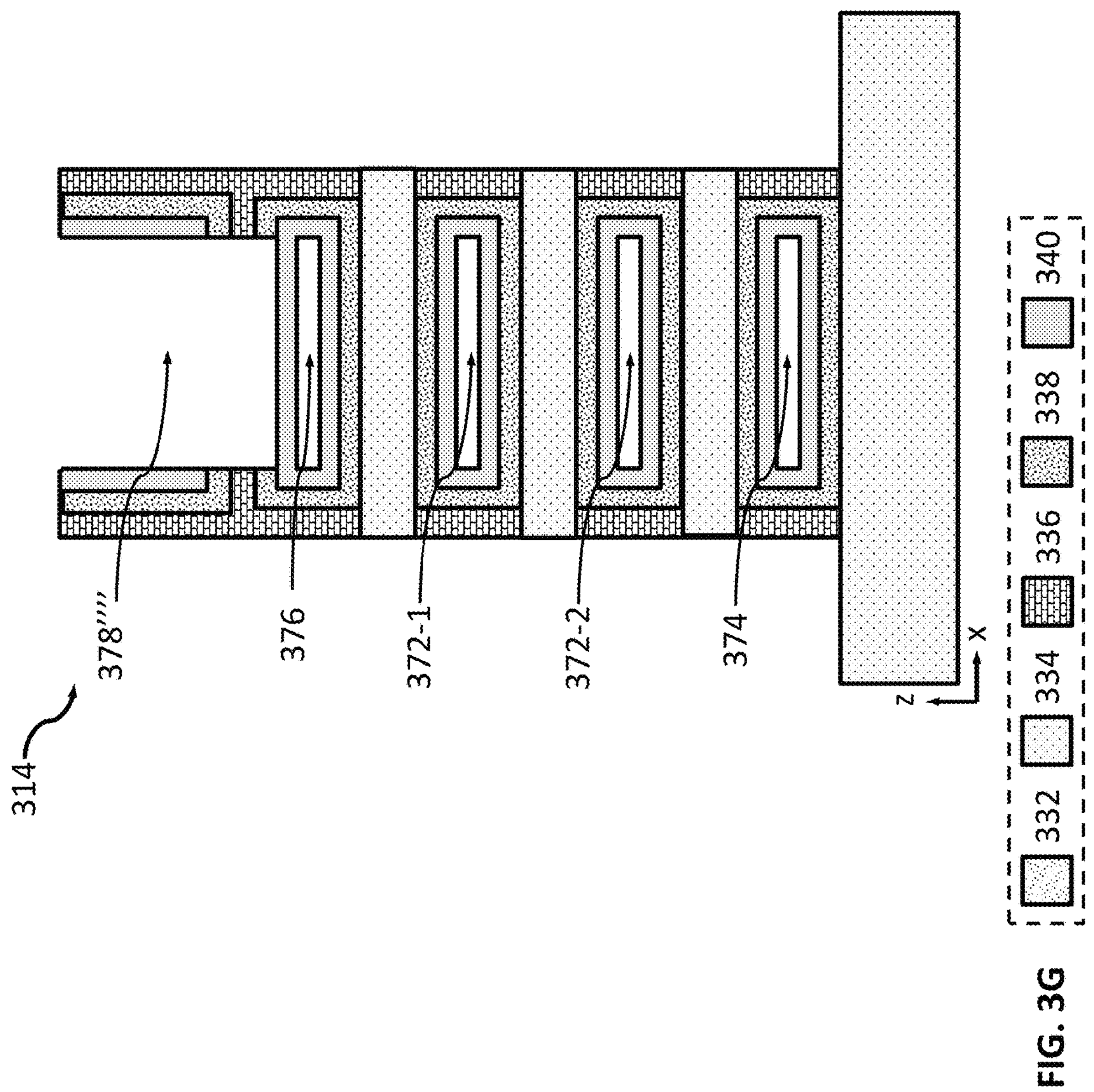

At 214, a portion of the gate insulator 338 exposed in the process 212 by the removal of the dielectric protection cap 360 may be removed. An IC structure 314, depicted in FIG. 3G, illustrates an example result of the process 214. As shown in FIG. 3G, the IC structure 314 is substantially the same as the IC structure 312, except that the portion of the gate insulator 338 exposed by the removal of the dielectric protection cap 360 at the bottom of the third extended spacer-lined opening 378''' is removed, thus deepening the third extended spacer-lined opening 378''' even further so that the spacer 340 that was deposited in the opening 366 is exposed, thereby turning the third extended spacer-lined opening 378''' into a fourth extended spacer-lined opening 378''''. In order to remove the gate insulator 338 substantially only at the bottom of the third extended spacer-lined opening 378''' formed at 212, any suitable anisotropic etch techniques may be used, such as any of the techniques described above. FIG. 3G illustrates an embodiment where the spacer 340 that was deposited in the opening 366 and exposed at the bottom of the fourth extended spacer-lined opening 378'''' is not substantially etched. This may be a result of careful timing of the etch of the process 214 and/or because the gate insulator 338 is sufficiently etch selective with respect to the dielectric protection cap 360. For example, if the gate insulator 338 includes hafnium oxide and the dielectric protection cap 360 includes silicon nitride, etchants used to etch the gate insulator 338 in the process 214 would not substantially etch the dielectric protection cap 360.

Figure 3H:
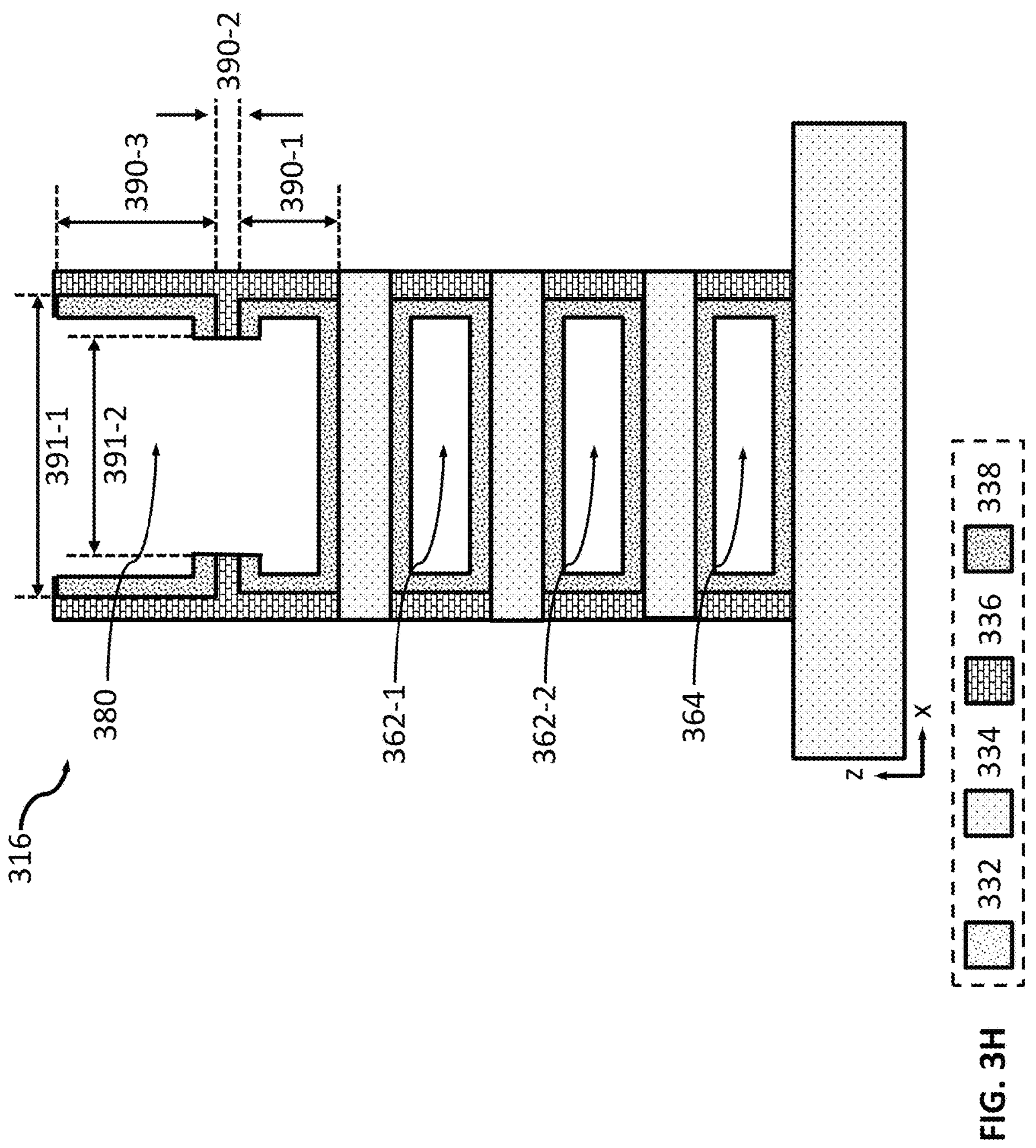

At 216, remaining portions of the spacer deposited at 206 may be removed. An IC structure 316, depicted in FIG. 3H, illustrates an example result of the process 216. As shown in FIG. 3H, the IC structure 316 is substantially the same as the IC structure 314, except that the spacer 340 in the fourth extended spacer-lined opening 378'''', as well as the spacer 340 in the spacer-lined openings 372, 374, and 376, is removed. To that end, an isotropic etch may be used, such as a wet etch, to remove all exposed portions of the spacer 340. If the spacer 340 is sufficiently etch selective with respect to the gate insulator 338, then etching of the remaining portions of the spacer 340 would not substantially etch remaining portions of the gate insulator 338, as is shown in FIG. 3H. As a result of removing the spacer 340 from the spacer-lined openings 372 and 374 at 216, these openings turn into, respectively, the gate insulator-lined openings 362 and 364, as they were at the end of 204. As a result of removing the remaining portion of the spacer 340 from the fourth extended spacer-lined opening 378"" at 216, a new opening 380 is created. The new opening 380 combines what used to be the gate insulator-lined openings 366 and 368 into a single opening, by removing the dielectric protection cap 360 therebetween, as well as removing the corresponding gate insulator 338 on either side of the dielectric protection cap 360.

Figure 3I:
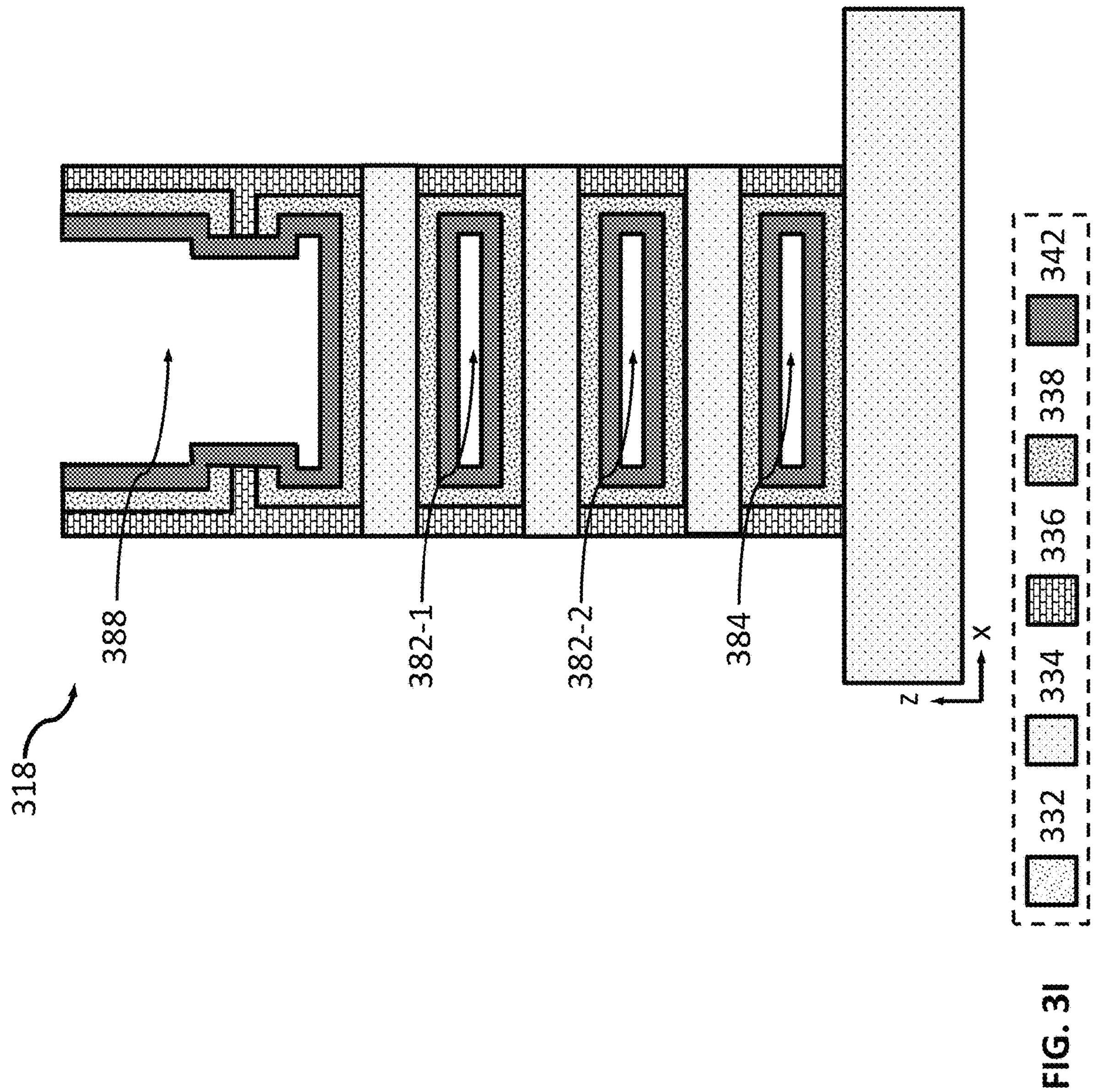
Figure 3J:
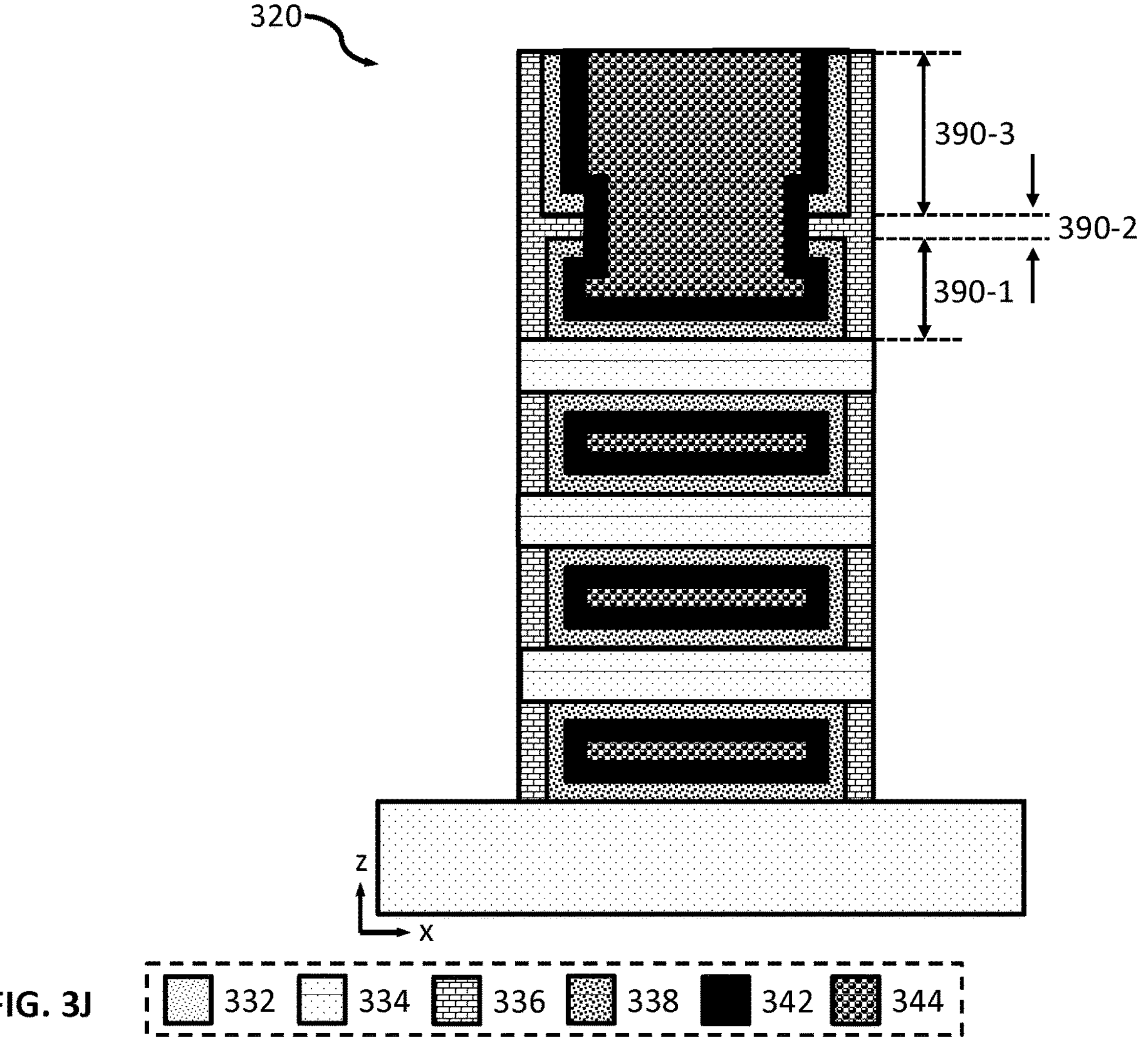

The method 200 may then proceed with providing a gate electrode material between pairs of adjacent nanoribbons of the stack and in the opening above the top nanoribbon. For example, in some embodiments, the method 200 may include a process 218, in which a work function material may be deposited on all exposed surfaces. An IC structure 318, depicted in FIG. 3I, illustrates an example result of the process 218. As shown in FIG. 3I, the IC structure 318 may include a work function material 342 lining all exposed surfaces of the gate insulator-lined openings 362 and 364, and the new opening 380 that were formed at 216. As a result of depositing the work function material 342, the gate insulator-lined openings 362 and 364 become, respectively, work function material-lined openings 382 and 384, while the new opening 380 becomes a work function material-lined opening 388. The work function material 342 deposited at 218 may take the form of a work function material of the gate stack 106 disclosed herein and may be provided at 218 using any suitable conformal deposition and patterning technique known in the art, such as ALD, CVD, or PVD, possibly in combination with using suitable masks and/or various patterning techniques. The method 200 may conclude with a process 220, in which a gate electrode material may be deposited in the work function material-lined openings 382, 384, and 388. An IC structure 320, depicted in FIG. 3J, illustrates an example result of the process 220. As shown in FIG. 3J, the IC structure 320 may include a gate electrode material 344 deposited in the work function material-lined openings 382, 384, and 388 that were formed at 218. The gate electrode material 344 deposited at 220 may take the form of the gate electrode material 108 of the gate stack 106 disclosed herein and may be provided at 220 using any suitable deposition technique known in the art, such as ALD, CVD, or PVD, possibly in combination with using suitable masks and/or various patterning techniques. In other embodiments, the method 200 may not include process 218, in which case the IC structure 320 would be as shown in FIG. 3J except that it would not include the work function material 342.

As a result of performing the method 200, several unique characteristic features may be present in the final IC structure such as the IC structure 320. Some such features may be described by referring to the opening 380 (i.e., the opening above the top nanoribbon 334 in which the gate electrode material 344 is deposited) as having three portions: a first portion 390-1, a second portion 390-2, and a third portion 390-3, as labeled in FIG. 3H. As shown in FIG. 3H, the second portion 390-2 is between the first portion 390-1 and the third portion 390-3 (i.e., the first portion 390-1 is closer to the support structure 332 than the second portion 390-2, and the second portion 390-2 is closer to the support structure 332 than the third portion 390-3). What is unique about these portions is that the gate insulator 338 is present on sidewalls of the first portion 390-1 and the third portion 390-3, as well as at the bottom of the first portion 390-1, but is absent from the sidewalls of the second portion 390-2. In other words, the gate insulator 338 on the sidewalls of the first portion 390-1 is materially discontinuous from the gate insulator 338 on the sidewalls of the third portion 390-3. Another unique feature is that a width 391-2 of the second portion 390-2 is smaller than a width 391-1 of at least a part of the first portion 390-1 or the third portion 390-3, as can be seen in FIG. 3H. Similarly, a width of the portion of the gate electrode material 344 in the second portion 390-2 is smaller than a width of a portion of the gate electrode material 344 in the first portion 390-1 and a width of a portion of the gate electrode material 344 in the third portion 390-3, as can be seen in FIG. 3J. As also can be seen in FIG. 3J, different portions of the gate electrode material 344 (i.e., portions of the gate electrode material 344 in the first, second, and third portions 390) may be portions of a materially continuous gate electrode material 344. When the work function material 342 is present in the IC structure 320, the gate insulator 338 is on the sidewalls of the first portion 390-1 and is between (e.g., in contact with) the sidewalls of the first portion 390-1 and a portion of the work function material 342 over the sidewalls of the first portion 390-1, and the gate insulator 338 on the sidewalls of the third portion 390-3 is between (e.g., in contact with) the sidewalls of the third portion 390-3 and a portion of the work function material 342 over the sidewalls of the third portion 390-3. Seen from the perspective of the gate electrode material 344, the portion of the work function material 342 over the sidewalls of the first portion 390-1 is between the sidewalls of the first portion and a portion of the gate electrode material 344 in the first portion 390-1 (and may be in contact with the latter), and the portion of the work function material 342 over the sidewalls of the third portion 390-3 is between the sidewalls of the third portion 390-3 and a portion of the gate electrode material 344 in the third portion 390-3 (and may be in contact with the latter). On the other hand, a portion of the work function material 342 over the sidewalls of the second portion 390-2 is between (e.g., in contact with) the sidewalls of the second portion 390-2 and a portion of the gate electrode material 344 in the second portion 390-2. These different portions of the work function material 342 (i.e., portions of the work function material 342 in the first, second, and third portions 390) may be portions of a materially continuous work function material 342, where the materially continuous work function material 342 has a U-shaped cross-section in the first portion 390-1. The work function material 342 may be a liner on the sidewalls of the first, second, and third portions 390, as well as at the bottom of the first portion 390-1, where a thickness of the liner in different ones of the first, second, and third portions 390 may be substantially the same.

Nanoribbon transistors formed on the basis of the nanoribbon stacks without dielectric protection caps for top nanoribbons described herein (e.g., as described with reference to FIGS. 1-3) may be used to implement any suitable components. For example, in various embodiments, transistors described herein may be part of one or more of: a central processing unit, a memory device (e.g., a high-bandwidth memory device), a memory cell, a logic circuit, input/output circuitry, a field programmable gate array (FPGA) component such as an FPGA transceiver or an FPGA logic, a power delivery circuitry, an amplifier (e.g., a III-V amplifier), Peripheral Component Interconnect Express (PCIE) circuitry, Double Data Rate (DDR) transfer circuitry, a computing device (e.g., a wearable or a handheld computing device), etc.

The IC structures/devices with nanoribbon stacks without dielectric protection caps for top nanoribbons, disclosed herein, may be included in any suitable electronic device. FIGS. 4-8 illustrate various examples of apparatuses that may include one or more nanoribbon stacks without dielectric protection caps for top nanoribbons as disclosed herein.

Figure 4:
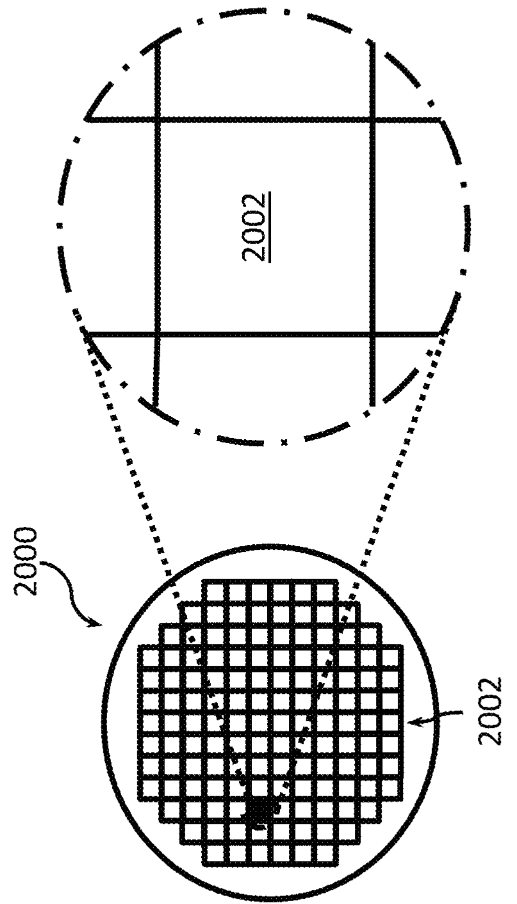
FIG. 4 provides top views of a wafer and dies that may include one or more nanoribbon stacks without dielectric protection caps for top nanoribbons in accordance with any of the embodiments disclosed herein.

FIG. 4 illustrates top views of a wafer 2000 and dies 2002 that may include one or more nanoribbon stacks without dielectric protection caps for top nanoribbons in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 5. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more nanoribbon stacks without dielectric protection caps for top nanoribbons as described herein). After the fabrication of the semiconductor product is complete (e.g., after manufacture of any embodiment of the nanoribbon stacks without dielectric protection caps for top nanoribbons as described herein), the wafer 2000 may undergo a singulation process in which each of the dies 2002 is separated from one another to provide discrete "chips" of the semiconductor product. In particular, devices that include one or more nanoribbon transistors as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., a hysteretic memory device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 7) or other logic that is configured to store information in the memory devices or execute instructions stored in the memory array.

Figure 5:
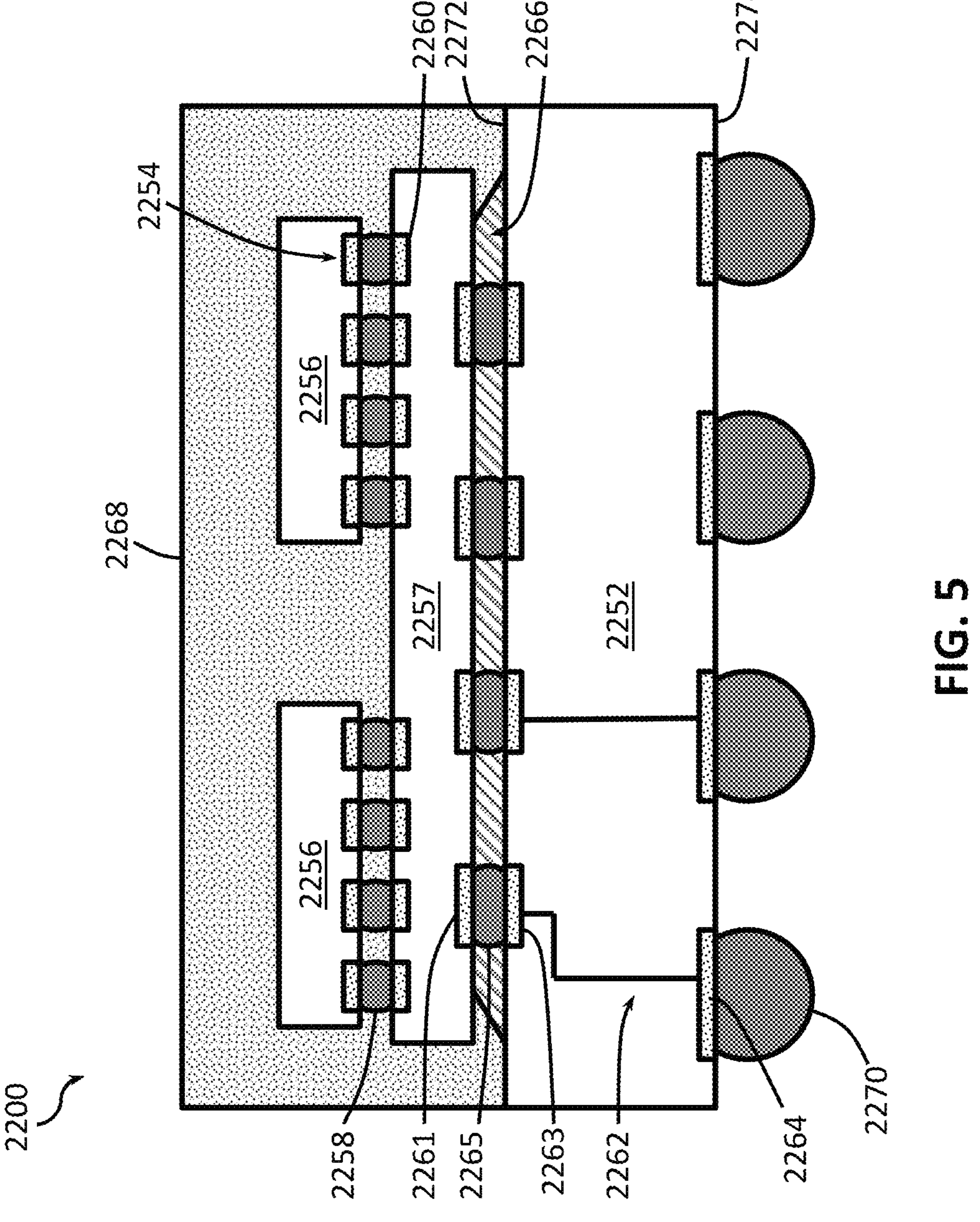
FIG. 5 is a cross-sectional side view of an IC package that may include one or more nanoribbon stacks without dielectric protection caps for top nanoribbons in accordance with any of the embodiments disclosed herein.

FIG. 5 is a side, cross-sectional view of an example IC package 2200 that may include one or more nanoribbon stacks without dielectric protection caps for top nanoribbons in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 5 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 5 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 5 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 6.

The dies 2256 may take the form of any of the embodiments of the die 2002 discussed herein (e.g., may include any of the embodiments of the nanoribbon stacks without dielectric protection caps for top nanoribbons as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high-bandwidth memory), including embedded memory dies as described herein. In some embodiments, any of the dies 2256 may include one or more nanoribbon stacks without dielectric protection caps for top nanoribbons, e.g., as discussed above; in some embodiments, at least some of the dies 2256 may not include any nanoribbon stacks without dielectric protection caps for top nanoribbons.

The IC package 2200 illustrated in FIG. 5 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 5, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 6:
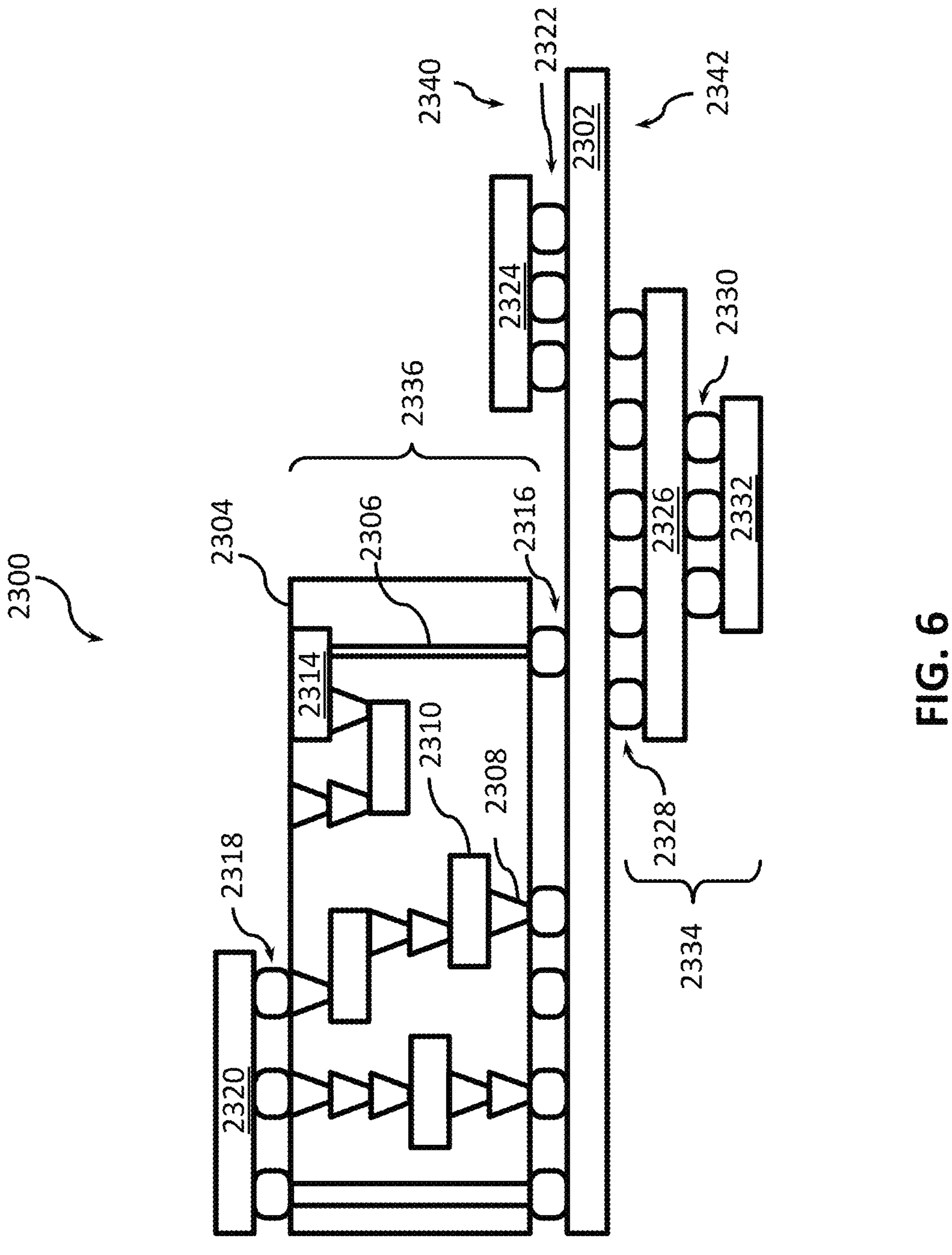
FIG. 6 is a cross-sectional side view of an IC device assembly that may include one or more nanoribbon stacks without dielectric protection caps for top nanoribbons in accordance with any of the embodiments disclosed herein.

FIG. 6 is a cross-sectional side view of an IC device assembly 2300 that may include components having one or more nanoribbon stacks without dielectric protection caps for top nanoribbons in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more nanoribbon stacks without dielectric protection caps for top nanoribbons in accordance with any of the embodiments disclosed herein; e.g., any of the IC packages discussed below with reference to the IC device assembly 2300 may take the form of any of the embodiments of the IC package 2200 discussed above with reference to FIG. 5 (e.g., may include one or more nanoribbon stacks without dielectric protection caps for top nanoribbons provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 6 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 6), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 4), an IC device, or any other suitable component. In particular, the IC package 2320 may include one or more nanoribbon stacks without dielectric protection caps for top nanoribbons as described herein. Although a single IC package 2320 is shown in FIG. 6, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 6, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as RF devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 6 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 7:
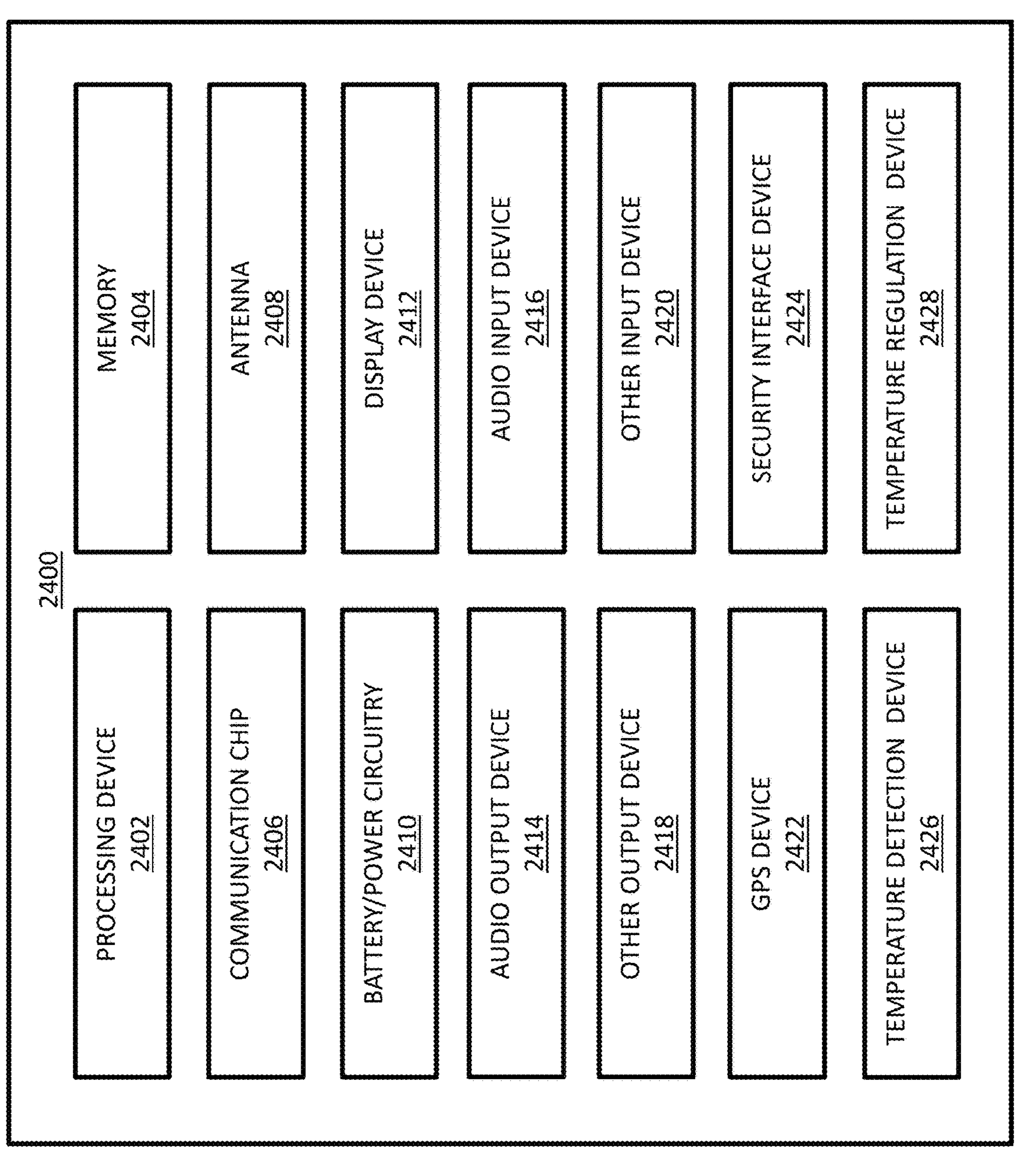
FIG. 7 is a block diagram of an example computing device that may include one or more nanoribbon stacks without dielectric protection caps for top nanoribbons in accordance with any of the embodiments disclosed herein.

FIG. 7 is a block diagram of an example computing device 2400 that may include one or more components including one or more nanoribbon stacks without dielectric protection caps for top nanoribbons in accordance with any of the embodiments disclosed herein. For example, any suitable ones of the components of the computing device 2400 may include a die (e.g., the die 2002 of FIG. 4) having one or more nanoribbon transistors as described herein. Any one or more of the components of the computing device 2400 may include, or be included in, an IC package 2200 of FIG. 5 or an IC device assembly 2300 of FIG. 6.

A number of components are illustrated in FIG. 7 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system-on-a-chip (SoC) die.

Additionally, in various embodiments, the computing device 2400 may not include one or more of the components illustrated in FIG. 7, but the computing device 2400 may include interface circuitry for coupling to the one or more components. For example, the computing device 2400 may not include a display device 2412, but may include display device interface circuitry (e.g., a connector and driver circuitry) to which a display device 2412 may be coupled. In another set of examples, the computing device 2400 may not include an audio input device 2416 or an audio output device 2414, but may include audio input or output device interface circuitry (e.g., connectors and supporting circuitry) to which an audio input device 2416 or audio output device 2414 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded DRAM (eDRAM) or spin transfer torque MRAM.

In some embodiments, the computing device 2400 may include a communication chip 2406 (e.g., one or more communication chips). For example, the communication chip 2406 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2406 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2406 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2406 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2406 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2406 may operate in accordance with other wireless protocols in other embodiments. The computing device 2400 may include an antenna 2408 to facilitate wireless communications and/or to receive other wireless communications (such as AM or FM radio transmissions).

In some embodiments, the communication chip 2406 may manage wired communications, such as electrical, optical, or any other suitable communication protocols (e.g., the Ethernet). As noted above, the communication chip 2406 may include multiple communication chips. For instance, a first communication chip 2406 may be dedicated to shorter-range wireless communications such as Wi-Fi or Bluetooth, and a second communication chip 2406 may be dedicated to longer-range wireless communications such as global positioning system (GPS), EDGE, GPRS, CDMA, WiMAX, LTE, EV-DO, or others. In some embodiments, a first communication chip 2406 may be dedicated to wireless communications, and a second communication chip 2406 may be dedicated to wired communications.

The computing device 2400 may include a battery/power circuitry 2410. The battery/power circuitry 2410 may include one or more energy storage devices (e.g., batteries or capacitors) and/or circuitry for coupling components of the computing device 2400 to an energy source separate from the computing device 2400 (e.g., AC line power).

The computing device 2400 may include a display device 2412 (or corresponding interface circuitry, as discussed above). The display device 2412 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2414 (or corresponding interface circuitry, as discussed above). The audio output device 2414 may include any device that generates an audible indicator, such as speakers, headsets, or earbuds, for example.

The computing device 2400 may include an audio input device 2416 (or corresponding interface circuitry, as discussed above). The audio input device 2416 may include any device that generates a signal representative of a sound, such as microphones, microphone arrays, or digital instruments (e.g., instruments having a musical instrument digital interface (MIDI) output).

The computing device 2400 may include an other output device 2418 (or corresponding interface circuitry, as discussed above). Examples of the other output device 2418 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may include a GPS device 2422 (or corresponding interface circuitry, as discussed above). The GPS device 2422 may be in communication with a satellite-based system and may receive a location of the computing device 2400, as known in the art.

The computing device 2400 may include a security interface device 2424. The security interface device 2424 may include any device that provides security features for the computing device 2400 or for any individual components therein (e.g., for the processing device 2402 or for the memory 2404). Examples of security features may include authorization, access to digital certificates, access to items in keychains, etc. Examples of the security interface device 2424 may include a software firewall, a hardware firewall, an antivirus, a content filtering device, or an intrusion detection device.

In some embodiments, the computing device 2400 may include a temperature detection device 2426 and a temperature regulation device 2428.

The temperature detection device 2426 may include any device capable of determining temperatures of the computing device 2400 or of any individual components therein (e.g., temperatures of the processing device 2402 or of the memory 2404). In various embodiments, the temperature detection device 2426 may be configured to determine temperatures of an object (e.g., the computing device 2400, components of the computing device 2400, devices coupled to the computing device, etc.), temperatures of an environment (e.g., a data center that includes, is controlled by, or otherwise associated with the computing device 2400), and so on. The temperature detection device 2426 may include one or more temperature sensors. Different temperature sensors of the temperature detection device 2426 may have different locations within and around the computing device 2400. A temperature sensor may generate data (e.g., digital data) representing detected temperatures and provide the data to another device, e.g., to the temperature regulation device 2428, the processing device 2402, the memory 2404, etc. In some embodiments, a temperature sensor of the temperature detection device 2426 may be turned on or off, e.g., by the processing device 2402 or an external system. The temperature sensor detects temperatures when it is on and does not detect temperatures when it is off. In other embodiments, a temperature sensor of the temperature detection device 2426 may detect temperatures continuously and automatically or detect temperatures at predefined times or at times triggered by an event associated with the computing device 2400 or any components therein.

The temperature regulation device 2428 may include any device configured to change (e.g., decrease) temperatures, e.g., based on one or more target temperatures and/or based on temperature measurements performed by the temperature detection device 2426. A target temperature may be a preferred temperature. A target temperature may depend on a setting in which the computing device 2400 operates. In some embodiments, the target temperature may be 200 Kelvin degrees or lower. In some embodiments, the target temperature may be 20 Kelvin degrees or lower, or 5 Kelvin degrees or lower. Target temperatures for different objects and different environments of, or associated with, the computing device 2400 can be different. In some embodiments, cooling provided by the temperature regulation device 2428 may be a multi-stage process with temperatures ranging from room temperature to 4K or lower.

In some embodiments, the temperature regulation device 2428 may include one or more cooling devices. Different cooling devices may have different locations within and around the computing device 2400. A cooling device of the temperature regulation device 2428 may be associated with one or more temperature sensors of the temperature detection device 2426 and may be configured to operate based on temperatures detected by the temperature sensors. For instance, a cooling device may be configured to determine whether a detected ambient temperature is above the target temperature or whether the detected ambient temperature is higher than the target temperature by a predetermined value or determine whether any other temperature-related condition associated with the temperature of the computing device 2400 is satisfied. In response to determining that one or more temperature-related conditions associated with the temperature of the computing device 2400 are satisfied (e.g., in response to determining that the detected ambient temperature is above the target temperature), a cooling device may trigger its cooling mechanism and start to decrease the ambient temperature. Otherwise, the cooling device does not trigger any cooling. A cooling device of the temperature regulation device 2428 may operate with various cooling mechanisms, such as evaporation cooling, radiation cooling, conduction cooling, convection cooling, other cooling mechanisms, or any combination thereof. A cooling device of the temperature regulation device 2428 may include a cooling agent, such as water, oil, liquid nitrogen, liquid helium, etc. In some embodiments, the temperature regulation device 2428 may be, for example, a dilution refrigerator, a helium-3 refrigerator, or a liquid helium refrigerator. In some embodiments, the temperature regulation device 2428 or any portions thereof (e.g., one or more of the individual cooling devices) may be connected to the computing device 2400 in close proximity (e.g., less than about 1 meter) or may be provided in a separate enclosure where a dedicated heat exchanger (e.g., a compressor, a heating, ventilation, and air conditioning (HVAC) system, liquid helium, liquid nitrogen, etc.) may reside.

By maintaining the target temperatures, the energy consumption of the computing device 2400 (or components thereof) can be reduced, while the computing efficiency may be improved. For example, when the computing device 2400 (or components thereof) operates at lower temperatures, energy dissipation (e.g., heat dissipation) may be reduced. Further, energy consumed by semiconductor components (e.g., energy needed for switching transistors of any of the components of the computing device 2400) can also be reduced. Various semiconductor materials may have lower resistivity and/or higher mobility at lower temperatures. That way, the electrical current per unit supply voltage may be increased by lowering temperatures. Conversely, for the same current that would be needed, the supply voltage may be lowered by lowering temperatures. As energy correlates to the supply voltage, the energy consumption of the semiconductor components may be lower too. In some implementations, the energy savings due to reducing heat dissipation and reducing energy consumed by semiconductor components of the computing device or components thereof may outweigh (sometimes significantly outweigh) the costs associated with energy needed for cooling.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Figure 8:
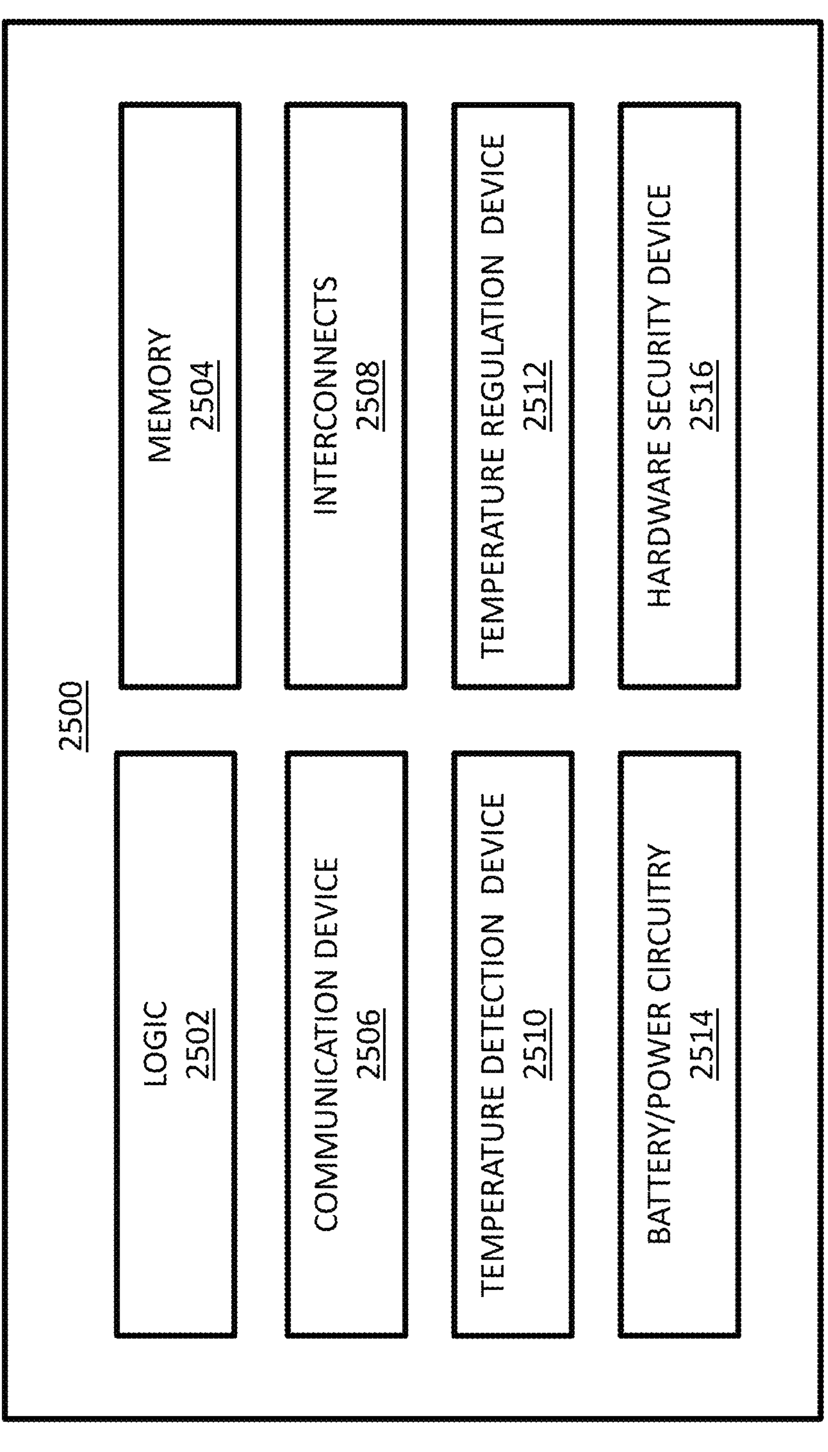
FIG. 8 is a block diagram of an example processing device that may include one or more nanoribbon stacks without dielectric protection caps for top nanoribbons in accordance with any of the embodiments disclosed herein.

FIG. 8 is a block diagram of an example processing device 2500 that may include one or more nanoribbon stacks without dielectric protection caps for top nanoribbons in accordance with any of the embodiments disclosed herein. For example, any suitable ones of the components of the processing device 2500 may include a die (e.g., the die 2002 of FIG. 4) having one or more nanoribbon transistors as described herein. Any one or more of the components of the processing device 2500 may include, or be included in, an IC device assembly 2300 (FIG. 6). Any one or more of the components of the processing device 2500 may include, or be included in, an IC package 2200 of FIG. 5 or an IC device assembly 2300 of FIG. 6. Any one or more of the components of the processing device 2500 may include, or be included in, a computing device 2400 of FIG. 7; for example, the processing device 2500 may be the processing device 2402 of the computing device 2400.

A number of components are illustrated in FIG. 8 as included in the processing device 2500, but any one or more of these components may be omitted or duplicated, as suitable for the application. In some embodiments, some or all of the components included in the processing device 2500 may be attached to one or more motherboards. In some embodiments, some or all of these components are fabricated on a single SoC die or coupled to a single support structure, e.g., to a single carrier substrate.

Additionally, in various embodiments, the processing device 2500 may not include one or more of the components illustrated in FIG. 8, but the processing device 2500 may include interface circuitry for coupling to the one or more components. For example, the processing device 2500 may not include a memory 2504, but may include display device interface circuitry (e.g., a connector and driver circuitry) to which a memory 2504 may be coupled.

The processing device 2500 may include logic circuitry 2502 (e.g., one or more circuits configured to implement logic/compute functionality). Examples of such circuits include ICs implementing one or more of input/output (I/O) functions, arithmetic operations, pipelining of data, etc.

In some embodiments, the logic circuitry 2502 may include one or more circuits responsible for read/write operations with respect to the data stored in the memory 2504. To that end, the logic circuitry 2502 may include one or more I/O ICs configured to control access to data stored in the memory 2504.

In some embodiments, the logic circuitry 2502 may include one or more high-performance compute dies, configured to perform various operations with respect to data stored in the memory 2504 (e.g., arithmetic and logic operations, pipelining of data from one or more memory dies of the memory 2504, and possibly also data from external devices/chips). In some embodiments, the logic circuitry 2502 may be configured to only control I/O access to data but not perform any operations on the data. In some embodiments, the logic circuitry 2502 may implement ICs configured to implement I/O control of data stored in the memory 2504, assemble data from the memory 2504 for transport (e.g., transport over a central bus) to devices/chips that are either internal or external to the processing device 2500, etc. In some embodiments, the logic circuitry 2502 may not be configured to perform any operations on the data besides I/O and assembling for transport to the memory 2504.

The processing device 2500 may include a memory 2504, which may include one or more ICs configured to implement memory circuitry (e.g., ICs implementing one or more of memory devices, memory arrays, control logic configured to control the memory devices and arrays, etc.). In some embodiments, the memory 2504 may be implemented substantially as described above with reference to the memory 2404 (FIG. 7). In some embodiments, the memory 2504 may be a designated device configured to provide storage functionality for the components of the processing device 2500 (i.e., local), while the memory 2404 may be configured to provide system-level storage functionality for the entire computing device 2400 (i.e., global). In some embodiments, the memory 2504 may include memory that shares a die with the logic circuitry 2502.

In some embodiments, the memory 2504 may include a flat memory (also sometimes referred to as a "flat hierarchy memory" or a "linear memory") and, therefore, may also be referred to as a "basin memory." As known in the art, a flat memory or a linear memory refers to a memory addressing paradigm in which memory may appear to the program as a single contiguous address space, where a processor can directly and linearly address all of the available memory locations without having to resort to memory segmentation or paging schemes. Thus, the memory implemented in the memory 2504 may be a memory that is not divided into hierarchical layers or levels in terms of access of its data.

In some embodiments, the memory 2504 may include a hierarchical memory. In this context, hierarchical memory refers to the concept of computer architecture where computer storage is separated into a hierarchy based on features of memory such as response time, complexity, capacity, performance, and controlling technology. Designing for high performance may require considering the restrictions of the memory hierarchy, i.e., the size and capabilities of each component. With hierarchical memory, each of the various memory components can be viewed as part of a hierarchy of memories ($m_1, m_2, \ldots, m_n$) in which each member $m_i$ is typically smaller and faster than the next highest member $m_{i+1}$ of the hierarchy. To limit waiting by higher levels, a lower level of a hierarchical memory structure may respond by filling a buffer and then signaling for activating the transfer. For example, in some embodiments, the hierarchical memory implemented in the memory 2504 may be separated into four major storage levels: 1) internal storage (e.g., processor registers and cache), 2) main memory (e.g., the system RAM and controller cards), and 3) on-line mass storage (e.g., secondary storage), and 4) off-line bulk storage (e.g., tertiary, and off-line storage). However, as the number of levels in the memory hierarchy and the performance at each level has increased over time and is likely to continue to increase in the future, this example hierarchical division provides only one non-limiting example of how the memory 2504 may be arranged.

The processing device 2500 may include a communication device 2506, which may be implemented substantially as described above with reference to the communication chip 2406 (FIG. 7). In some embodiments, the communication device 2506 may be a designated device configured to provide communication functionality for the components of the processing device 2500 (i.e., local), while the communication chip 2406 may be configured to provide system-level communication functionality for the entire computing device 2400 (i.e., global).

The processing device 2500 may include interconnects 2508, which may include any element or device that includes an electrically conductive material for providing electrical connectivity to one or more components of, or associated with, a processing device 2500 or/and between various such components. Examples of the interconnects 2508 include conductive lines/wires (also sometimes referred to as "lines" or "metal lines" or "trenches") and conductive vias (also sometimes referred to as "vias" or "metal vias"), metallization stacks, redistribution layers, metal-insulator-metal (MIM) structures, etc.

The processing device 2500 may include a temperature detection device 2510 which may be implemented substantially as described above with reference to the temperature detection device 2426 of FIG. 7 but configured to determine temperatures on a more local scale, i.e., of the processing device 2500 orr components thereof. In some embodiments, the temperature detection device 2510 may be a designated device configured to provide temperature detection functionality for the components of the processing device 2500 (i.e., local), while the temperature detection device 2426 may be configured to provide system-level temperature detection functionality for the entire computing device 2400 (i.e., global).

The processing device 2500 may include a temperature regulation device 2512 which may be implemented substantially as described above with reference to the temperature regulation device 2428 of FIG. 7 but configured to regulate temperatures on a more local scale, i.e., of the processing device 2500 or components thereof. In some embodiments, the temperature regulation device 2512 may be a designated device configured to provide temperature regulation functionality for the components of the processing device 2500 (i.e., local), while the temperature regulation device 2428 may be configured to provide system-level temperature regulation functionality for the entire computing device 2400 (i.e., global).

The processing device 2500 may include a battery/power circuitry 2514 which may be implemented substantially as described above with reference to the battery/power circuitry 2410 of FIG. 7. In some embodiments, the battery/power circuitry 2514 may be a designated device configured to provide battery/power functionality for the components of the processing device 2500 (i.e., local), while the battery/power circuitry 2410 may be configured to provide system-level battery/power functionality for the entire computing device 2400 (i.e., global).

The processing device 2500 may include a hardware security device 2516 which may be implemented substantially as described above with reference to the security interface device 2424 of FIG. 7. In some embodiments, the hardware security device 2516 may be a physical computing device configured to safeguard and manage digital keys, perform encryption and decryption functions for digital signatures, authentication, and other cryptographic functions. In some embodiments, the hardware security device 2516 may include one or more secure cryptoprocessor chips.

The above description of illustrated implementations of the disclosure, including what is described in the Abstract, is not intended to be exhaustive or to limit the disclosure to the precise forms disclosed. Unless specified otherwise, in various embodiments, features described with respect to one of the drawings may be combined with those described with respect to other drawings.

The following paragraphs provide various examples of the embodiments disclosed herein.

Example 1 provides an IC device that includes a support structure (e.g., a die, a substrate, a carrier substrate, etc.); a stack of nanoribbons over the support structure; and an opening over a top nanoribbon of the stack, the opening including a first portion, a second portion, and a third portion, where the first portion is closer to the base than the second portion, the second portion is closer to the base than the third portion, and a gate insulator is on sidewalls of the first portion and the third portion and is absent from sidewalls of the second portion (i.e., the gate insulator on the sidewalls of the first portion is materially discontinuous from the gate insulator on the sidewalls of the third portion).

Example 2 provides the IC structure according to example 1, where a width of the second portion is smaller than a width of at least a part of the first portion.

Example 3 provides the IC structure according to any one of examples 1-2, where a width of the second portion is smaller than a width of at least a part of the third portion.

Example 4 provides the IC structure according to any one of examples 1-3, further including a work function material over the sidewalls of the opening, where the gate insulator on the sidewalls of the first portion is between the sidewalls of the first portion and a portion of the work function material over the sidewalls of the first portion, and the gate insulator on the sidewalls of the third portion is between the sidewalls of the third portion and a portion of the work function material over the sidewalls of the third portion.

Example 5 provides the IC structure according to example 4, further including a gate electrode material in the opening, where a portion of the work function material over the sidewalls of the second portion is between the sidewalls of the second portion and a portion of the gate electrode material in the second portion.

Example 6 provides the IC structure according to example 5, where the portion of the work function material over the sidewalls of the first portion, the portion of the work function material over the sidewalls of the second portion, and the portion of the work function material over the sidewalls of the third portion are portions of a materially continuous work function material.

Example 7 provides the IC structure according to example 6, where the materially continuous work function material has a U-shaped cross-section in the first portion.

Example 8 provides the IC structure according to any one of examples 5-7, where the portion of the work function material over the sidewalls of the first portion is between the sidewalls of the first portion and a portion of the gate electrode material in the first portion, and the portion of the work function material over the sidewalls of the third portion is between the sidewalls of the third portion and a portion of the gate electrode material in the third portion.

Example 9 provides the IC structure according to any one of examples 5-8, where a width of the portion of the gate electrode material in the second portion is smaller than a width of a portion of the gate electrode material in the first portion and a width of a portion of the gate electrode material in the third portion.

Example 10 provides the IC structure according to any one of examples 8-9, where the portion of the gate electrode material in the first portion, the portion of the gate electrode material in the second portion, and the portion of the gate electrode material in the third portion are portions of a materially continuous gate electrode material.

Example 11 provides an IC structure that includes a substrate; a stack of nanoribbons over the substrate; an opening over a top nanoribbon of the stack; and a gate electrode material in the opening, where the opening has a first portion, a second portion, and a third portion, the second portion is between the first portion and the third portion, and a width of a portion of the gate electrode material in the second portion is smaller than a width of a portion of the gate electrode material in the first portion.

Example 12 provides the IC structure according to example 11, where the width of the portion of the gate electrode material in the second portion is smaller than a width of a portion of the gate electrode material in the third portion.

Example 13 provides the IC structure according to example 12, where the portion of the gate electrode material in the first portion, the portion of the gate electrode material in the second portion, and the portion of the gate electrode material in the third portion are portions of a materially continuous gate electrode material.

Example 14 provides the IC structure according to any one of examples 11-13, further including a first gate insulator on a bottom and sidewalls of the first portion, and a second gate insulator on sidewalls of the third portion, where the first gate insulator is materially discontinuous from the second gate insulator.

Example 15 provides the IC structure according to example 14, further including a work function material, where a first portion of the work function material is a liner of the work function material between the first gate insulator on the bottom and the sidewalls of the first portion and the portion of the gate electrode material in the first portion, a second portion of the work function material is a liner of the work function material between sidewalls of the second portion and the portion of the gate electrode material in the second portion, and a third portion of the work function material is a liner of the work function material between the second gate insulator on the sidewalls of the third portion and the portion of the gate electrode material in the third portion.

Example 16 provides the IC structure according to example 15, where a thickness of the liner of the first portion of the work function material and a thickness of the liner of the second portion of the work function material are substantially equal.

Example 17 provides the IC structure according to any one of examples 15-16, where the first, second, and third portions of the work function material are portions of a materially continuous work function material.

Example 18 provides a method of fabricating an IC structure, the method including providing a stack of released nanoribbons over a support, a dielectric protection cap over a top nanoribbon of the stack, and an opening in a portion of the dielectric protection cap above the top nanoribbon; depositing a gate insulator on sidewalls and a bottom of the opening, between the dielectric protection cap and the top nanoribbon, and between pairs of adjacent nanoribbons of the stack; following deposition of the gate insulator, depositing a spacer over the sidewalls and the bottom of the opening, between the dielectric protection cap and the top nanoribbon, and between pairs of adjacent nanoribbons of the stack; removing a portion of the spacer at the bottom of the opening to expose a portion of the gate insulator at the bottom of the opening; removing the portion of the gate insulator at the bottom of the opening to expose a portion of the dielectric protection cap at the bottom of the opening; removing the portion of the dielectric protection cap at the bottom of the opening to expose a portion of the gate insulator that was deposited between the dielectric protection cap and the top nanoribbon; removing the portion of the gate insulator that was deposited between the dielectric protection cap and the top nanoribbon to expose a portion of the spacer that was deposited between the dielectric protection cap and the top nanoribbon; removing remaining portions of the spacer to form an opening above the top nanoribbon; and depositing gate electrode material between pairs of adjacent nanoribbons of the stack and in the opening above the top nanoribbon.

Example 19 provides the method according to example 18, where removing the portion of the spacer at the bottom of the opening includes performing an anisotropic etch and removing the remaining portions of the spacer includes performing an isotropic etch.

Example 20 provides the method according to any one of examples 18-19, where the opening above the top nanoribbon includes a first portion, a second portion, and a third portion, the second portion is between the first portion and the third portion, and a width of a portion of the gate electrode material in the second portion is smaller than a width of a portion of the gate electrode material in the first portion.

Example 21 provides the method according to any one of examples 18-20, where the IC structure is an IC structure according to any one of the preceding examples.

Example 22 provides an IC package that includes an IC die including an IC structure according to any one of examples 1-17; and a further IC component, coupled to the IC die.

Example 23 provides the IC package according to example 22, where the further IC component includes a package substrate.

Example 24 provides the IC package according to example 22, where the further IC component includes an interposer.

Example 25 provides the IC package according to example 22, where the further IC component includes a further IC die.

Example 26 provides a computing device that includes a carrier substrate and an IC structure coupled to the carrier substrate, where the IC structure is an IC structure according to any one of examples 1-17, or the IC structure is included in the IC package according to any one of examples 22-25.

Example 27 provides the computing device according to example 26, where the computing device is a wearable or handheld computing device.

Example 28 provides the computing device according to examples 26 or 27, where the computing device further includes one or more communication chips.

Example 29 provides the computing device according to any one of examples 26-28, where the computing device further includes an antenna.

Example 30 provides the computing device according to any one of examples 26-29, where the carrier substrate is a motherboard.

Example 31 provides the IC structure according to any one of examples 1-17, where the IC structure includes or is a part of a central processing unit.

Example 32 provides the IC structure according to any one of examples 1-31, where the IC structure includes or is a part of a memory device, e.g., a high-bandwidth memory device.

Example 33 provides the IC structure according to any one of examples 1-32, where the IC structure includes or is a part of a logic circuit.

Example 34 provides the IC structure according to any one of examples 1-33, where the IC structure includes or is a part of input/output circuitry.

Example 35 provides the IC structure according to any one of examples 1-34, where the IC structure includes or is a part of an FPGA transceiver.

Example 36 provides the IC structure according to any one of examples 1-35, where the IC structure includes or is a part of an FPGA logic.

Example 37 provides the IC structure according to any one of examples 1-36, where the IC structure includes or is a part of a power delivery circuitry.

Example 38 provides the IC structure according to any one of examples 1-37, where the IC structure includes or is a part of a III-V amplifier.

Example 39 provides the IC structure according to any one of examples 1-38, where the IC structure includes or is a part of PCIE circuitry or DDR transfer circuitry.

The invention claimed is:

1. An integrated circuit (IC) structure, comprising:
a base;
a stack of nanoribbons over the base; and
an opening over a top nanoribbon of the stack, the opening comprising a first portion, a second portion, and a third portion, wherein:
the first portion is closer to the base than the second portion,
the second portion is closer to the base than the third portion, and
a gate insulator is on sidewalls of the first portion and the third portion and is absent from sidewalls of the second portion.

2. The IC structure according to claim 1, wherein a width of the second portion is smaller than a width of at least a part of the first portion.

3. The IC structure according to claim 1, wherein a width of the second portion is smaller than a width of at least a part of the third portion.

4. The IC structure according to claim 1, further comprising a work function material over the sidewalls of the opening, wherein:
the gate insulator on the sidewalls of the first portion is between the sidewalls of the first portion and a portion of the work function material over the sidewalls of the first portion, and
the gate insulator on the sidewalls of the third portion is between the sidewalls of the third portion and a portion of the work function material over the sidewalls of the third portion.

5. The IC structure according to claim 4, further comprising a gate electrode material in the opening, wherein:
a portion of the work function material over the sidewalls of the second portion is between the sidewalls of the second portion and a portion of the gate electrode material in the second portion.

6. The IC structure according to claim 5, wherein the portion of the work function material over the sidewalls of the first portion, the portion of the work function material over the sidewalls of the second portion, and the portion of the work function material over the sidewalls of the third portion are portions of a materially continuous work function material.

7. The IC structure according to claim 6, wherein the materially continuous work function material has a U-shaped cross-section in the first portion.

8. The IC structure according to claim 5, wherein:
the portion of the work function material over the sidewalls of the first portion is between the sidewalls of the first portion and a portion of the gate electrode material in the first portion, and
the portion of the work function material over the sidewalls of the third portion is between the sidewalls of the third portion and a portion of the gate electrode material in the third portion.

9. The IC structure according to claim 5, wherein a width of the portion of the gate electrode material in the second portion is smaller than a width of a portion of the gate electrode material in the first portion and a width of a portion of the gate electrode material in the third portion.

10. The IC structure according to claim 9, wherein the portion of the gate electrode material in the first portion, the portion of the gate electrode material in the second portion, and the portion of the gate electrode material in the third portion are portions of a materially continuous gate electrode material.

11. An integrated circuit (IC) structure, comprising:
a support;
a stack of nanoribbons over the support;
an opening over a top nanoribbon of the stack; and
a gate electrode material in the opening,
wherein:
the opening has a first portion, a second portion, and a third portion,
the second portion is between the first portion and the third portion, and
a width of a portion of the gate electrode material in the second portion is smaller than a width of a portion of the gate electrode material in the first portion.

12. The IC structure according to claim 11, wherein the width of the portion of the gate electrode material in the second portion is smaller than a width of a portion of the gate electrode material in the third portion.

13. The IC structure according to claim 12, wherein the portion of the gate electrode material in the first portion, the portion of the gate electrode material in the second portion, and the portion of the gate electrode material in the third portion are portions of a materially continuous gate electrode material.

14. The IC structure according to claim 11, further comprising:
a first gate insulator on a bottom and sidewalls of the first portion, and
a second gate insulator on sidewalls of the third portion,
wherein the first gate insulator is materially discontinuous from the second gate insulator.

15. The IC structure according to claim 14, further comprising a work function material, wherein:
a first portion of the work function material is a liner of the work function material between the first gate insulator on the bottom and the sidewalls of the first portion and the portion of the gate electrode material in the first portion,
a second portion of the work function material is a liner of the work function material between sidewalls of the second portion and the portion of the gate electrode material in the second portion, and
a third portion of the work function material is a liner of the work function material between the second gate insulator on the sidewalls of the third portion and the portion of the gate electrode material in the third portion.

16. The IC structure according to claim 15, wherein a thickness of the liner of the first portion of the work function material and a thickness of the liner of the second portion of the work function material are substantially equal.

17. The IC structure according to claim 15, wherein the first, second, and third portions of the work function material are portions of a materially continuous work function material.

18. A process of making an integrated circuit (IC) structure, the process comprising:

providing a stack of nanoribbons over a base; and providing an opening over a top nanoribbon of the stack, the opening comprising a first portion, a second portion, and a third portion, wherein:

the first portion is closer to the base than the second portion, the second portion is closer to the base than the third portion, and a gate insulator is on sidewalls of the first portion and the third portion and is absent from sidewalls of the second portion.

19. The process according to claim 18, wherein:

a width of the second portion is smaller than a width of at least a part of the first portion.

20. The process according to claim 18, wherein:

a width of the second portion is smaller than a width of at least a part of the third portion.

* * * * *